United States Patent
Tamasaki et al.

(10) Patent No.: US 9,124,243 B2
(45) Date of Patent: Sep. 1, 2015

(54) SURFACE ACOUSTIC WAVE FILTER DEVICE

(71) Applicant: Murata Manufacturing Co., Ltd., Nagaokakyo-shi, Kyoto-fu (JP)

(72) Inventors: Daisuke Tamasaki, Nagaokakyo (JP); Kenichi Uesaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 174 days.

(21) Appl. No.: 13/943,963

(22) Filed: Jul. 17, 2013

(65) Prior Publication Data

US 2013/0300519 A1 Nov. 14, 2013

Related U.S. Application Data

(63) Continuation of application No. PCT/JP2011/080362, filed on Dec. 28, 2011.

(30) Foreign Application Priority Data

Jan. 18, 2011 (JP) .................................. 2011-007967

(51) Int. Cl.
*H03H 9/64* (2006.01)
*H03H 9/02* (2006.01)
(Continued)

(52) U.S. Cl.
CPC ............. *H03H 9/64* (2013.01); *H01L 41/1873* (2013.01); *H03H 9/02559* (2013.01);
(Continued)

(58) Field of Classification Search
CPC .......... H03H 9/02543; H03H 9/02559; H03H 9/02834; H03H 9/64; H03H 9/6423; H03H 9/6426; H03H 9/6483; H03H 9/6493; H03H 9/6496; H03H 9/725; H03H 9/14541; H03H 41/1873
USPC ................... 333/133, 193–196, 313 B, 313 D
See application file for complete search history.

(56) References Cited

U.S. PATENT DOCUMENTS 4,243,960 A * 1/1981 White et al. .................. 333/196
5,726,610 A * 3/1998 Allen et al. ................... 333/133
(Continued)

FOREIGN PATENT DOCUMENTS

JP 07-283688 A 10/1995
JP 8-46467 * 2/1996
(Continued)

OTHER PUBLICATIONS

English language machine translation of JP 2000-196409, published Jul. 14, 2000.*

(Continued)

*Primary Examiner* — Barbara Summons
(74) *Attorney, Agent, or Firm* — Keating & Bennett, LLP

(57) ABSTRACT

A surface acoustic wave filter device uses a Rayleigh wave as a main mode, and includes a ladder type surface acoustic wave filter unit. A thickness of a dielectric layer in a surface acoustic wave resonator configuring a series arm resonator is different from thickness of a dielectric layer in a surface acoustic wave resonator configuring a parallel arm resonator. A propagation orientation of a surface acoustic wave in the surface acoustic wave resonator configuring the series arm resonator is different from a propagation orientation of a surface acoustic wave in the surface acoustic wave resonator configuring the parallel arm resonator.

20 Claims, 13 Drawing Sheets

(51) Int. Cl.
  *H03H 9/72* (2006.01)
  *H03H 9/54* (2006.01)
  *H01L 41/187* (2006.01)
  *H03H 9/145* (2006.01)

(52) U.S. Cl.
  CPC ............ *H03H 9/02834* (2013.01); *H03H 9/54* (2013.01); *H03H 9/6483* (2013.01); *H03H 9/725* (2013.01); *H03H 9/14541* (2013.01)

(56) References Cited

U.S. PATENT DOCUMENTS

| | | | |
|---|---|---|---|
| 6,489,863 B2 * | 12/2002 | Taniguchi | 333/193 |
| 6,717,487 B2 * | 4/2004 | Takata | 333/133 |
| 2002/0140519 A1 * | 10/2002 | Takayama et al. | 333/133 |
| 2004/0246077 A1 * | 12/2004 | Misu et al. | 333/195 |
| 2007/0152774 A1 | 7/2007 | Nakanishi et al. | |
| 2008/0074212 A1 | 3/2008 | Matsuda et al. | |
| 2009/0009028 A1 | 1/2009 | Nishiyama et al. | |
| 2010/0207707 A1 | 8/2010 | Yata | |
| 2012/0019102 A1 * | 1/2012 | Seki et al. | 310/313 C |

FOREIGN PATENT DOCUMENTS

| | | |
|---|---|---|
| JP | 2000-068784 A | 3/2000 |
| JP | 2000-196409 A | 7/2000 |
| JP | 2008-079227 A | 4/2008 |
| WO | 2007/125734 A1 | 11/2007 |
| WO | 2009/119007 A1 | 10/2009 |
| WO | 2010/122767 A1 | 10/2010 |

OTHER PUBLICATIONS

English language machine translatoin of JP 7-283688, published Oct. 27, 1995.*
Official Communication issued in International Patent Application No. PCT/JP2011/080362, mailed on Mar. 13, 2012.
English translation of Official Communication issued in corresponding German Patent Application No. 11 2011 104 736.3, mailed on Feb. 26, 2014.

* cited by examiner

SURFACE ACOUSTIC WAVE FILTER DEVICE

BACKGROUND OF THE INVENTION

1. Field of the Invention

The present invention relates to a surface acoustic wave filter device. In particular, the present invention relates to a surface acoustic wave filter device including a ladder type surface acoustic wave filter unit.

2. Description of the Related Art

In the past, for example, as band pass filters or demultiplexers installed in RF (Radio Frequency) circuits in communication devices such as cellular phone devices, surface acoustic wave filter devices, each utilizing a surface acoustic wave, have been used. As an example of such a surface acoustic wave filter device, for example, in the following Japanese Unexamined Patent Application Publication No. 2000-196409, a surface acoustic wave filter device has been described that includes a ladder type surface acoustic wave filter unit. In Japanese Unexamined Patent Application Publication No. 2000-196409, it has been described that, in a plurality of surface acoustic wave resonators configuring a ladder type surface acoustic wave filter unit, a protective film is provided on the IDT electrode of each surface acoustic wave resonator and by causing the thickness of a protective film on an IDT electrode in a parallel arm surface acoustic wave resonator and the thickness of a protective film on an IDT electrode in a series arm surface acoustic wave resonator to be different from each other, a filter characteristics is caused to be steep and a frequency characteristic in a pass band is caused to be flat.

However, in the surface acoustic wave filter device described in Japanese Unexamined Patent Application Publication No. 2000-196409, there is a problem that a ripple occurs within the pass band.

SUMMARY OF THE INVENTION

Accordingly, preferred embodiments of the present invention provide a surface acoustic wave filter device that has a steep filter characteristic and a wide pass band and in which a ripple within a pass band is suppressed.

A surface acoustic wave filter device according to a preferred embodiment of the present invention uses a Rayleigh wave as a main mode and includes a ladder type surface acoustic wave filter unit. The ladder type surface acoustic wave filter unit includes a series arm, a series arm resonator, a parallel arm, and a parallel arm resonator. The series arm resonator is connected in the series arm. The parallel arm connects the series arm and ground to each other. The parallel arm resonator is provided in the parallel arm. Each of the series arm resonator and the parallel arm resonator is a surface acoustic wave resonator including a piezoelectric substrate, an IDT electrode, and a dielectric layer. The IDT electrode is located on the piezoelectric substrate. The dielectric layer is arranged so as to cover the IDT electrode. A thickness of the dielectric layer in the surface acoustic wave resonator configuring the series arm resonator is different from a thickness of the dielectric layer in the surface acoustic wave resonator configuring the parallel arm resonator, and a propagation orientation of a surface acoustic wave in the surface acoustic wave resonator configuring the series arm resonator is different from a propagation orientation of a surface acoustic wave in the surface acoustic wave resonator configuring the parallel arm resonator.

In a specific aspect of the surface acoustic wave filter device according to a preferred embodiment of the present invention, the piezoelectric substrate preferably includes a $LiNbO_3$ substrate, and in Euler angles ($\phi$, $\theta$, $\psi$), the $\theta$ preferably falls within a range of about 25 degrees to about 45 degrees, for example, and the $\psi$ corresponds to the propagation orientation of the surface acoustic wave in the surface acoustic wave resonator configuring the series arm resonator and the propagation orientation of the surface acoustic wave in the surface acoustic wave resonator configuring the parallel arm resonator.

In addition, in the description of preferred embodiments of the present invention, the Euler angles ($\phi$, $\theta$, $\psi$) indicate the cut surface of the piezoelectric substrate and the propagation direction of the surface acoustic wave. In the description of preferred embodiments of the present invention, the Euler angles ($\phi$, $\theta$, $\psi$) are the right-handed system Euler angles described in the document "Danseiha Soshi Gijutsu Handobukku" (Handbook of Acoustic Wave Device Technology) (Acoustic wave device technology 150th committee of Japan Society for the Promotion of Science, the first impression of the first edition, issued on Nov. 30, 2001, page 549). In other words, the X axis is rotated counterclockwise around the Z axis by the $\phi$ with respect to the crystallographic axes X, Y, and Z of the piezoelectric substrate, and an Xa axis is obtained. Next, the Z axis is rotated counterclockwise by the $\theta$ around the Xa axis, and a Z' axis is obtained. A surface that includes the Xa axis and has the Z' axis as the normal line is defined as the cut surface of the substrate. In addition, an axis X' direction obtained by counterclockwise rotation of the Xa axis around the Z' axis by the $\psi$ is defined as the propagation direction of the surface acoustic wave. In addition, as for the crystallographic axes X, Y, and Z of the piezoelectric substrate assigned as the initial values of the Euler angles, the Z axis is parallel to the c axis, the X axis is parallel to any one of the equivalent a axes in three directions, and the Y axis extends in a direction normal to a surface including the X axis and Z axis.

In another specific aspect of the surface acoustic wave filter device according to a preferred embodiment of the present invention, an angle defined by the propagation orientation of the surface acoustic wave in the surface acoustic wave resonator configuring the series arm resonator with the propagation orientation of the surface acoustic wave in the surface acoustic wave resonator configuring the parallel arm resonator preferably is larger than 0 degrees and less than or equal to about 8 degrees, for example.

In another specific aspect of the surface acoustic wave filter device according to a preferred embodiment of the present invention, the dielectric layer in the surface acoustic wave resonator configuring the series arm resonator is thicker than the dielectric layer in the surface acoustic wave resonator configuring the parallel arm resonator, the $\psi$ of the surface acoustic wave resonator configuring the series arm resonator preferably falls within a range of 0 degrees±1 degrees, for example, and the $\psi$ of the surface acoustic wave resonator configuring the parallel arm resonator preferably falls within a range of about 1 degrees to about 8 degrees, for example.

In yet another specific aspect of the surface acoustic wave filter device according to a preferred embodiment of the present invention, the $\psi$ of the surface acoustic wave resonator configuring the parallel arm resonator preferably falls within a range of about 3.5 degrees to about 6.5 degrees, for example.

In yet another specific aspect of the surface acoustic wave filter device according to a preferred embodiment of the present invention, the dielectric layer in the surface acoustic wave resonator configuring the series arm resonator is thinner than the dielectric layer in the surface acoustic wave resonator configuring the parallel arm resonator, the ψ of the surface acoustic wave resonator configuring the series arm resonator preferably falls within a range of about 1 degrees to about 8 degrees, for example, and the ψ of the surface acoustic wave resonator configuring the parallel arm resonator preferably falls within a range of 0 degrees±1 degrees, for example.

In yet another specific aspect of the surface acoustic wave filter device according to a preferred embodiment of the present invention, the ψ of the surface acoustic wave resonator configuring the series arm resonator preferably falls within a range of about 3.5 degrees to about 6.5 degrees, for example.

In yet another specific aspect of the surface acoustic wave filter device according to a preferred embodiment of the present invention, the dielectric layer includes a $SiO_2$ layer. In addition, the dielectric layer may be only the $SiO_2$ layer, and may also be a laminated body including the $SiO_2$ layer.

In yet another specific aspect of the surface acoustic wave filter device according to a preferred embodiment of the present invention, the piezoelectric substrate in the series arm resonator and the piezoelectric substrate in the parallel arm resonator are a common piezoelectric substrate.

According to various preferred embodiments of the present invention, it is possible to provide a surface acoustic wave filter device that has a steep filter characteristic and a wide pass band and in which a ripple within a pass band is suppressed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with citing, as an example, a surface acoustic wave filter device 1 illustrated in FIG. 1. The surface acoustic wave filter device 1 of the present preferred embodiment preferably is a duplexer including a ladder type surface acoustic wave filter unit. The duplexer is one type of demultiplexer. In this regard, however, the surface acoustic wave filter device according to the present invention is not limited to the duplexer. As long as the surface acoustic wave filter device according to the present invention includes a ladder type surface acoustic wave filter unit, the surface acoustic wave filter device according to the present invention is not specifically limited, may also be another demultiplexer such as a triplexer, may also be a filter device including a plurality of filter units where at least input signal terminals or output signal terminals are not connected in common, and may also be a filter device including only one ladder type surface acoustic wave filter unit.

Figure 1:
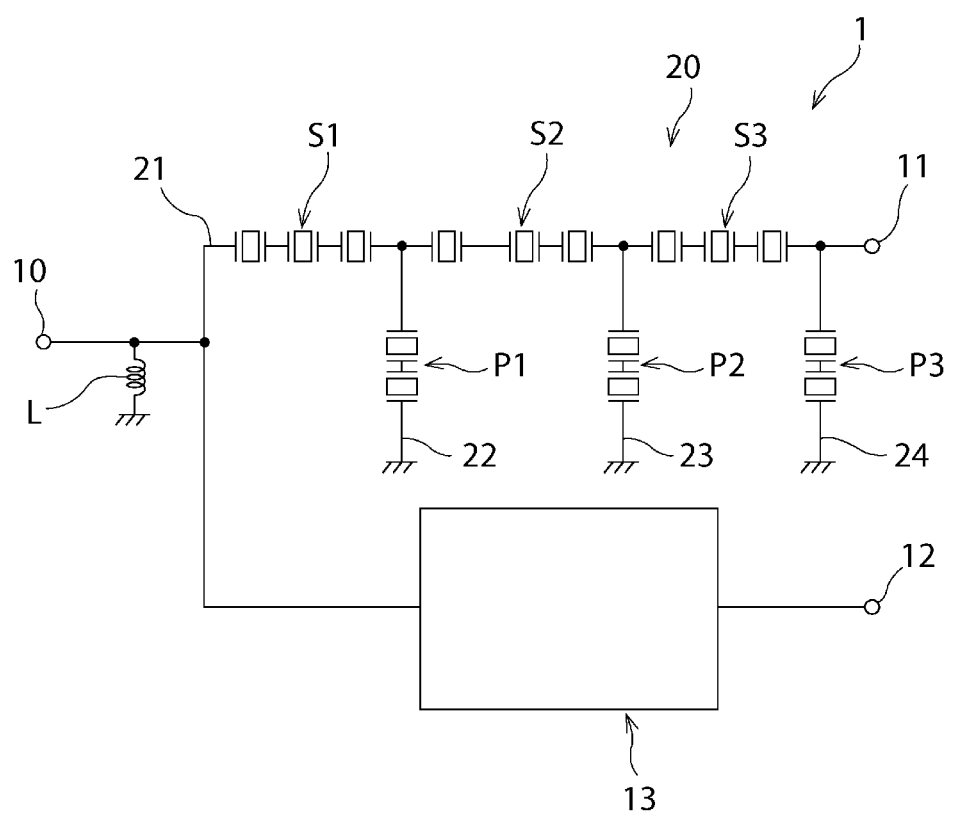
FIG. 1 is an equivalent circuit diagram of a surface acoustic wave filter device according to a preferred embodiment of the present invention.
Figure 2:
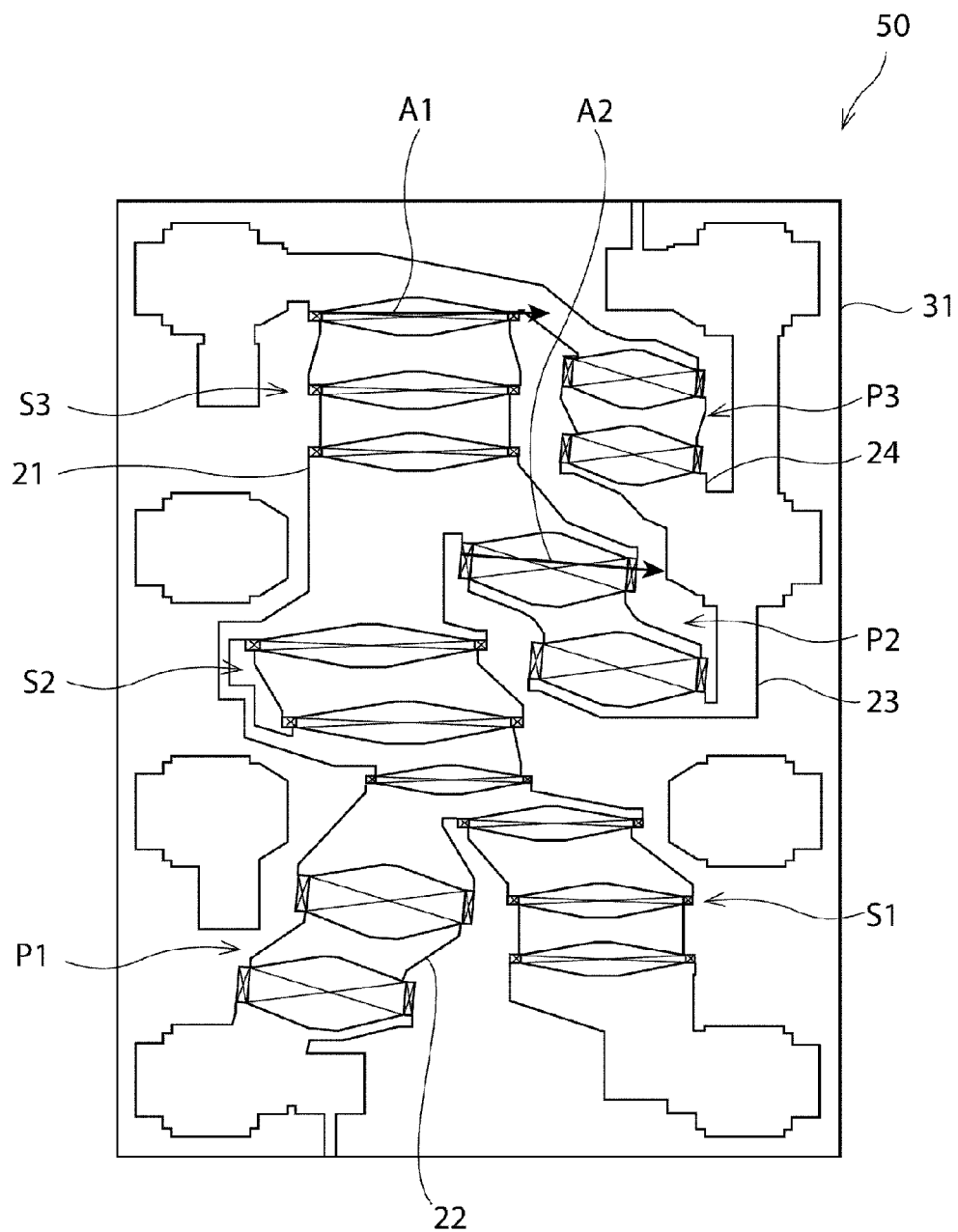
FIG. 2 is a schematic transparent plan view of a surface acoustic wave filter chip in a preferred embodiment of the present invention.
Figure 3:
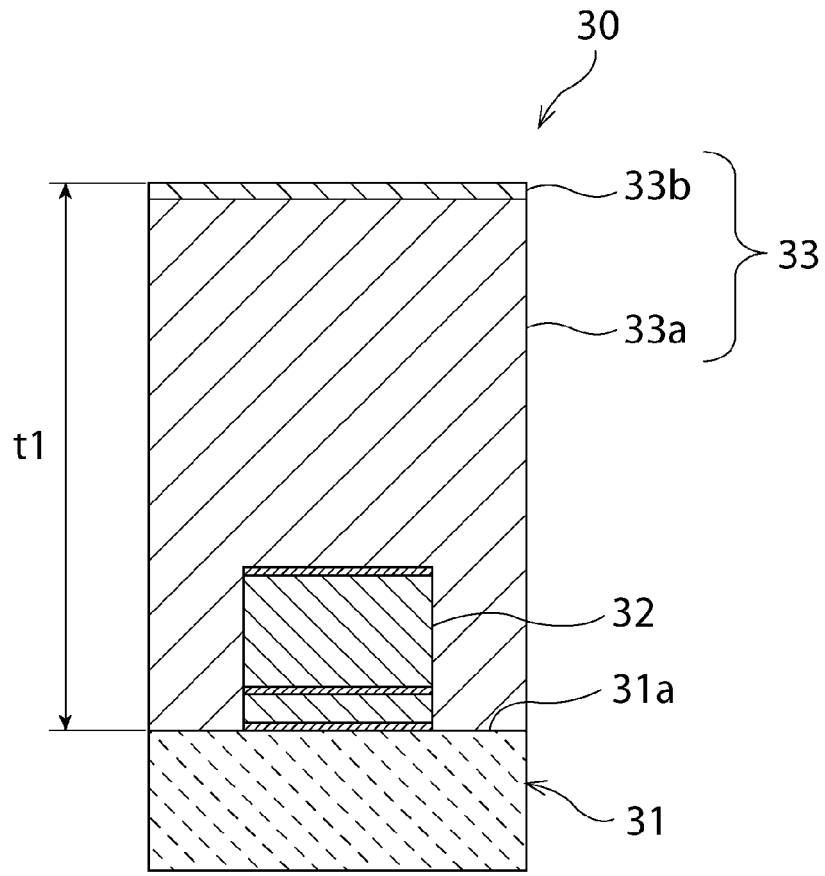
FIG. 3 is a schematic cross-sectional view of a portion of a surface acoustic wave resonator configuring a series arm resonator in a preferred embodiment of the present invention.
Figure 4:
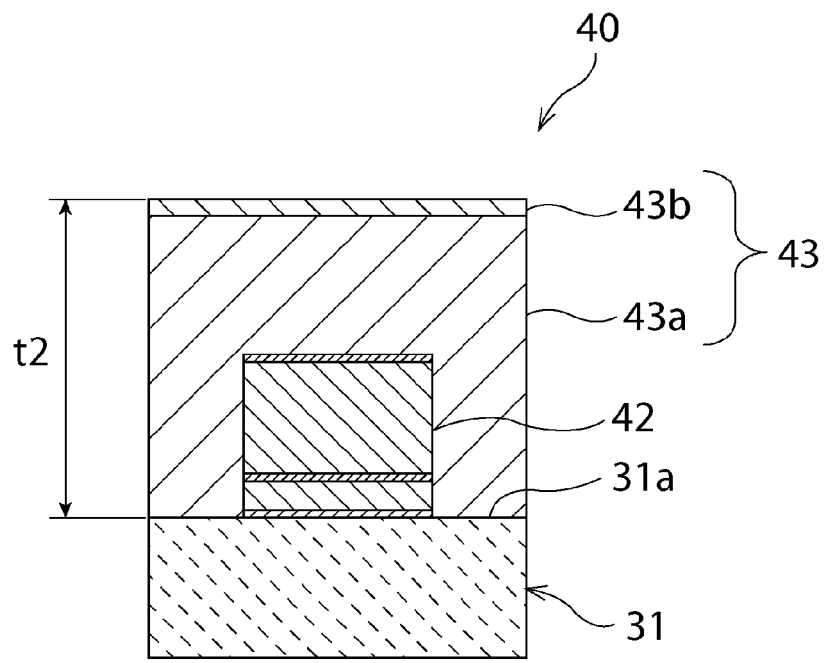
FIG. 4 is a schematic cross-sectional view of a portion of a surface acoustic wave resonator configuring a parallel arm resonator in a preferred embodiment of the present invention.

FIG. 1 is the equivalent circuit diagram of the surface acoustic wave filter device 1 according to the present preferred embodiment. FIG. 2 is the schematic transparent plan view of a surface acoustic wave filter chip in the present preferred embodiment. FIG. 3 is the schematic cross-sectional view of a portion of a surface acoustic wave resonator 30 configuring series arm resonators S1, S2, and S3 in the present preferred embodiment. FIG. 4 is the schematic cross-sectional view of a portion of a surface acoustic wave resonator 40 configuring parallel arm resonators P1, P2, and P3 in the present preferred embodiment.

The surface acoustic wave filter device 1 of the present preferred embodiment preferably is, for example, a filter device installed in an RF circuit in an cellular phone device or the like compatible with a CDMA system such as UMTS. Specifically, the surface acoustic wave filter device 1 preferably is a duplexer compatible with UMTS-BAND3. The transmission frequency band of the UMTS-BAND3 is 1710 MHz to 1785 MHz, and the reception frequency band thereof is 1805 MHz to 1880 MHz. In this way, in the UMTS-BAND3, the transmission side frequency band is located on a low frequency side, compared with the reception-side frequency band.

As illustrated in FIG. 1, the surface acoustic wave filter device 1 includes an antenna terminal 10 connected to an antenna, a transmission-side signal terminal 11, and a reception-side signal terminal 12. Between the antenna terminal 10 and the reception-side signal terminal 12, a reception filter is connected. In the present preferred embodiment, the configuration of the reception filter 13 is not specifically limited. The reception filter 13 may include, for example, a longitudinally coupled resonator-type surface acoustic wave filter unit, and may also include a ladder type surface acoustic wave filter unit. In addition, while, in FIG. 1, one reception-side signal terminal 12 only is illustrated, when the reception filter 13 includes a balanced-type filter unit having a balanced-unbalanced transforming function, two reception-side signal terminals are provided.

Between the antenna terminal 10 and the transmission-side signal terminal 11, a transmission filter 20 is connected. Between ground and a connection point located between the antenna terminal 10 and a connection point located between the transmission filter 20 and the reception filter 13, an inductor L is connected as a matching circuit.

The transmission filter 20 includes the ladder type surface acoustic wave filter unit. The transmission filter 20 includes a series arm 21 connecting the antenna terminal 10 and the transmission-side signal terminal 11 to each other. The plural series arm resonators S1, S2, and S3 are connected in series to the series arm 21. In addition, each of the series arm resonators S1, S2, and S3 preferably includes a plurality of surface acoustic wave resonators functioning as one resonator. As a result, the electric power handling capability of the transmission filter 20 is enhanced. However, in a preferred embodiment of the present invention, a series arm resonator may include a plurality of surface acoustic wave resonators functioning as one resonator, and may also be one surface acoustic wave resonator.

The transmission filter 20 includes a plurality of parallel arms 22, 23, and 24 connected between the series arm 21 and the ground. In the parallel arms 22, 23, and 24, the parallel arm resonators P1, P2, and P3 are provided, respectively. Each of the parallel arm resonators P1, P2, and P3 includes a plurality of surface acoustic wave resonators functioning as one resonator. As a result, the electric power handling capability of the transmission filter 20 is enhanced. However, in a preferred embodiment of the present invention, a parallel arm resonator may include a plurality of surface acoustic wave resonators functioning as one resonator, and may also be one surface acoustic wave resonator.

Next, with reference to FIG. 3 and FIG. 4, the configurations of the surface acoustic wave resonator 30 and the surface acoustic wave resonator 40 will be described, the surface acoustic wave resonator 30 configuring the series arm resonators S1, S2, and S3, the surface acoustic wave resonator 40 configuring the parallel arm resonators P1, P2, and P3.

Each of the surface acoustic wave resonators 30 and 40 includes a piezoelectric substrate 31. In other words, the surface acoustic wave resonators 30 and 40 share the piezoelectric substrate 31.

The surface acoustic wave resonator 30 includes an IDT electrode 32 and a dielectric layer 33. The IDT electrode 32 is located on the main surface 31a of the piezoelectric substrate 31. The dielectric layer 33 is located on the IDT electrode 32 and the main surface 31a of the piezoelectric substrate 31. In other words, the IDT electrode 32 is covered by the dielectric layer 33. On the other hand, the surface acoustic wave resonator 40 includes an IDT electrode 42 and a dielectric layer 43. The IDT electrode 42 is located on the main surface 31a of the piezoelectric substrate 31. The dielectric layer 43 is located on the IDT electrode 42 and the main surface 31a of the piezoelectric substrate 31. In other words, the IDT electrode 42 is covered by the dielectric layer 43.

Each of the IDT electrodes 32 and 42 includes one pair of comb electrodes. The comb electrode includes a plurality of electrode fingers and a busbar to which the plural electrode fingers are connected. In FIG. 3 and FIG. 4, the portions of the electrode fingers within the IDT electrodes 32 and 42 are only illustrated.

In the transmission filter 20 in the present preferred embodiment, a Rayleigh wave preferably is set as a main mode. Therefore, the piezoelectric substrate 31 is a LiNbO$_3$ substrate. More specifically, in the present preferred embodiment, the piezoelectric substrate 31 preferably is a LiNbO$_3$ substrate where θ of Euler angles (φ, θ, ψ) preferably falls within the range of about 25 degrees to about 45 degrees, for example. Therefore, it is possible to enlarge the electromechanical coupling coefficient of the Rayleigh wave, and it is possible to widen the pass band of the transmission filter 20. In addition, it is desirable that the φ preferably falls within the range of 0 degrees±5 degrees, for example.

However, in the present invention, the piezoelectric substrate may not be the LiNbO$_3$ substrate. The piezoelectric substrate may also be, for example, a LiTaO$_3$ substrate, a crystal substrate, or the like. Hereinafter, in the present preferred embodiment, an example will be described where the piezoelectric substrate 31 is the LiNbO$_3$ substrate whose Euler angles are (0 degrees, 37.5 degrees, ψ). In this case, in the transmission filter 20, the Rayleigh wave propagating in the direction of the ψ is set as a main mode. In other words, the ψ corresponds to a propagation orientation. In addition, the LiNbO$_3$ substrate whose Euler angles are (0 degrees, 37.5 degrees, ψ) is a 127.5-degree Y-cut X-propagation LiNbO$_3$ substrate, in another expression.

The IDT electrodes 32 and 42 are not specifically limited. The IDT electrodes 32 and 42 may be made of, for example, a metal selected from a group including Al, Pt, Cu, Au, Ag, W, Ni, Cr, Ti, Co, and Ta or an alloy including one or more types of metal selected from a group including Al, Pt, Cu, Au, Ag, W, Ni, Cr, Ti, Co, and Ta. In addition, the IDT electrodes 32 and 42 may also be defined by a laminated body including a plurality of conductive films containing the above-mentioned metal or alloy. Specifically, in the present preferred embodiment, each of the IDT electrodes 32 and 42 is preferably defined by a laminated body where a NiCr layer (a thickness: about 10 nm), a Pt layer (a thickness: about 40 nm), a Ti layer (a thickness: about 10 nm), an Al layer (a thickness: about 150 nm), and a Ti layer (a thickness: about 10 nm), for example, are laminated in this order from a piezoelectric substrate 31 side. In other words, in the IDT electrode 32 and the IDT electrode 42, the same layer structure is adopted. In the present preferred embodiment, the IDT electrodes 32 and 42 are preferably configured so that it is possible to set the Rayleigh wave as the main mode.

The dielectric layers 33 and 43 may be made of, for example, various kinds of dielectric materials such as $SiO_2$, SiN, SiON, $Ta_2O_5$, AlN, $Al_2O_3$, and ZnO. In addition, the dielectric layers 33 and 43 may also be made of, for example, a laminated body including a plurality of dielectric layers containing the above-mentioned dielectric materials. Among these, it is desirable that the dielectric layers 33 and 43 include $SiO_2$ layers. In this case, since the $SiO_2$ layer has a positive temperature coefficient of resonant frequency (TCF: Temperature Coefficient of Frequency) and the $LiNbO_3$ substrate has a negative temperature coefficient of resonant frequency, the signs of the temperature coefficients of resonant frequency of the dielectric layers 33 and 43 and the temperature coefficient of resonant frequency of the piezoelectric substrate 31 become opposite to each other. Therefore, it is possible to improve the frequency temperature characteristic of the transmission filter 20. Specifically, in the present preferred embodiment, the dielectric layers 33 and 43 are preferably defined by laminated bodies including $SiO_2$ layers 33a and 43a and SiN layers 33b and 43b. The $SiO_2$ layers 33a and 43a are arranged so as to cover the IDT electrodes 32 and 42 and the main surface 31a of the piezoelectric substrate 31. The SiN layers 33b and 43b are located on the $SiO_2$ layers 33a and 43a. In addition, the SiN layers 33b and 43b function as frequency adjustment films used to adjust the frequency of the transmission filter 20, by adjusting the thicknesses thereof. The thicknesses of the SiN layers 33b and 43b may be set to, for example, about 20 nm.

In the present preferred embodiment, the thickness of the $SiO_2$ layer 33a preferably is about 670 nm, and the thickness of the $SiO_2$ layer 43a preferably is about 370 nm, for example. Therefore, the thickness t1 of the dielectric layer 33 in the surface acoustic wave resonator 30 configuring the series arm resonators S1, S2, and S3 is thicker than the thickness t2 of the dielectric layer 43 in the surface acoustic wave resonator configuring the parallel arm resonators P1, P2, and P3 (t1>t2). Here, the thickness of the dielectric layer is a distance from the surface of the piezoelectric substrate coming into contact with the dielectric layer or the electrode fingers to the surface of the dielectric layer on a side opposite to a piezoelectric substrate side. In this regard, however, when there is an undulation in the surface shape of the dielectric layer within one wave length and the thickness thereof is uneven, the thickness is defined as the arithmetic mean value of the above-mentioned thicknesses of the dielectric layers distributed between the electrode fingers. Furthermore, when the thickness of the dielectric layer covering the IDT is non-uniform as a whole, a thickness between electrode fingers in the central portion of the IDT in a direction in which an elastic wave propagates is defined as the value of each of t1 and t2.

In FIG. 2, a transmission filter chip 50 is illustrated that serves as a surface acoustic wave filter chip in the surface acoustic wave filter device 1 of the present preferred embodiment. In the transmission filter chip 50, a plurality of the surface acoustic wave resonators 30 and 40 are provided to configure the series arm resonators S1, S2, and S3 and the parallel arm resonators P1, P2, and P3 in the transmission filter 20.

As illustrated in FIG. 2, in the present preferred embodiment, the propagation orientation A1 of a surface acoustic wave in the surface acoustic wave resonator 30 configuring the series arm resonators P1, S2, and S3 is caused to be different from the propagation orientation A2 of a surface acoustic wave in the surface acoustic wave resonator 40 configuring the parallel arm resonators P1, P2, and P3. Specifically, in the Euler angles ($\phi$, $\theta$, $\psi$) of the $LiNbO_3$ substrate serving as the piezoelectric substrate 31, the $\psi$ is preferably set to 0 degrees in the surface acoustic wave resonator 30, and the $\psi$ is preferably set to −5 degrees in the surface acoustic wave resonator 40. In this way, the surface acoustic wave resonators 30 and 40 are arranged so that an angle defined by the propagation orientation A1 with the propagation orientation A2 becomes greater than 0 degrees and less than or equal to about 8 degrees, for example. In other words, in the present preferred embodiment, as illustrated in FIG. 2, the IDT electrodes 32 and are arranged so that a difference between the propagation orientation A1 of a surface acoustic wave occurring in the IDT electrode 32 configuring the series arm resonator and the propagation orientation A2 of a surface acoustic wave occurring in the IDT electrode 42 configuring the parallel arm resonator becomes greater than 0 degrees and less than or equal to about 8 degrees (in other words, a difference in propagation angle between the series arm resonator and the parallel arm resonator becomes greater than 0 degrees and less than or equal to 8 degrees), for example.

In the UMTS-BAND3, the transmission frequency band is only 20 MHz away from the reception frequency band. In this way, in the duplexer compatible with a system where a spacing between the transmission frequency band and the reception frequency band is small, at least one of the transmission filter and the reception filter is desired to have a filter characteristic whose steepness is high or be superior in terms of a frequency temperature characteristic. In more detail, when the transmission frequency band is located on a low-frequency side, compared with the reception frequency band, the transmission filter is desired to have a filter characteristic where steepness on a pass band high-frequency side is high. In addition, when the transmission frequency band is located on a high-frequency side, compared with the reception frequency band, the transmission filter is desired to have a filter characteristic where steepness on a pass band low-frequency side is high.

Here, when the transmission filter includes a ladder type surface acoustic wave filter unit, so as to realize the filter characteristic where steepness on the pass band high-frequency side is high, it becomes necessary to reduce the Δf (a frequency difference between a resonant frequency and an anti-resonant frequency) of the surface acoustic wave resonator configuring the series arm resonator. The reason is that the Δf of the surface acoustic wave resonator configuring the series arm resonator largely influences the steepness on the pass band high-frequency side. On the other hand, so as to realize the filter characteristic where steepness on the pass band low-frequency side is high, it becomes necessary to reduce the Δf of the surface acoustic wave resonator configuring the parallel arm resonator. The reason is that the Δf of the surface acoustic wave resonator configuring the parallel arm resonator largely influences the steepness on the pass band low-frequency side.

In the surface acoustic wave resonator, the thickness of a dielectric layer is increased, the dielectric layer being arranged so as to cover the IDT electrode and the main surface of the piezoelectric substrate, and hence, it is possible to reduce the Δf. In particular, in the case of a surface acoustic wave resonator where the piezoelectric substrate is a $LiNbO_3$ substrate or a $LiTaO_3$ substrate, a dielectric layer including a $SiO_2$ layer is adopted, and the thickness of the dielectric layer is increased. Accordingly, it is possible to reduce the Δf and improve a frequency temperature characteristic. From the standpoint of improving both of the steepness of the transmission filter on the pass band high-frequency side and the steepness thereof on the pass band low-frequency side, it may be considered that the thicknesses of dielectric layers are increased in surface acoustic wave resonators configuring both of the series arm resonator and the parallel arm resonator.

Figure 5:
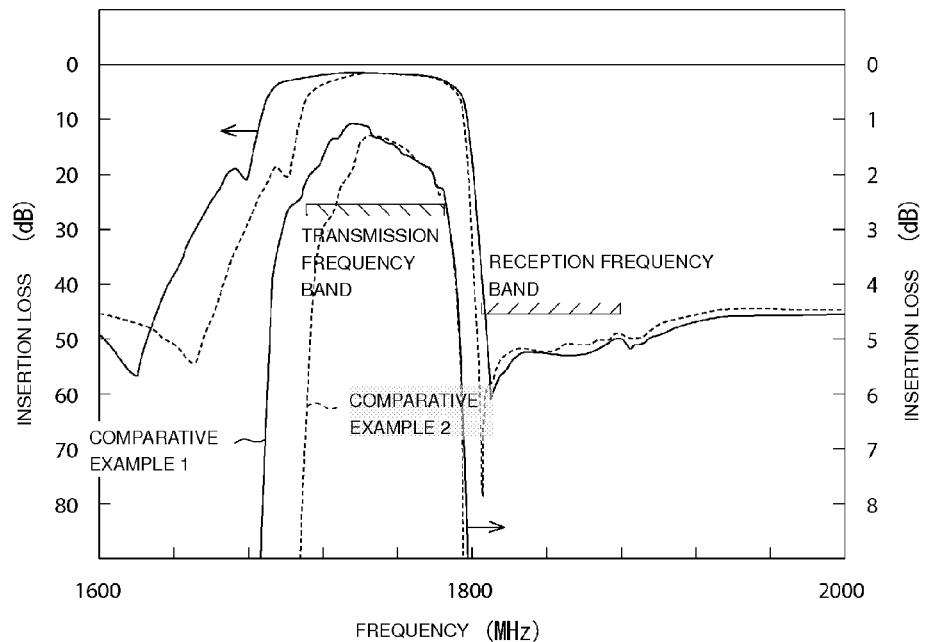
FIG. 5 is a graph illustrating a filter characteristic of a transmission filter in a surface acoustic wave filter device of a comparative example 1 and a filter characteristic of a transmission filter in a surface acoustic wave filter device of a comparative example 2.

As a comparative example 1, a surface acoustic wave filter device is prepared where the thicknesses of the dielectric layers 33 and 43 in the surface acoustic wave resonators 30 and 40 configuring the transmission filter 20 are set to 370 nm, and as a comparative example 2, a surface acoustic wave filter device is prepared where the thicknesses of the dielectric layers 33 and 43 in the surface acoustic wave resonators 30 and 40 configuring the transmission filter 20 are set to 670 nm. In FIG. 5, the filter characteristic of a transmission filter in the surface acoustic wave filter device of the comparative example 1 and the filter characteristic of a transmission filter in the surface acoustic wave filter device of the comparative example 2 are illustrated. In FIG. 5, a solid line indicates the comparative example 1, and a dashed line indicates the comparative example 2.

In the comparative example 1, since, in a surface acoustic wave resonator configuring both of a series arm resonator and a parallel arm resonator in the transmission filter, the thickness of a dielectric layer is decreased, the Δf of every surface acoustic wave resonator becomes large. Therefore, as understood from FIG. 5, while a pass band width is widened, both of steepness on a pass band high-frequency side and steepness on a pass band low-frequency side become low. Therefore, in the comparative example 1, an attenuation in the reception frequency band of the UMTS-BAND3 becomes insufficient.

In addition, in the comparative example 2, since, in a surface acoustic wave resonator configuring both of a series arm resonator and a parallel arm resonator in the transmission filter, the thickness of a dielectric layer is increased, the Δf of every surface acoustic wave resonator becomes small. Therefore, as understood from FIG. 5, while both of steepness on a pass band high-frequency side and steepness on a pass band low-frequency side become high, a pass band width is narrowed. Therefore, in the comparative example 3, a pass band width corresponding to the transmission frequency band of the UMTS-BAND3 is not realized. In this way, when the thickness of a dielectric layer in the surface acoustic wave resonator configuring the series arm resonator and the thickness of a dielectric layer in the surface acoustic wave resonator configuring the parallel arm resonator are caused to be equal to each other, it is difficult to realize a filter characteristic having high steepness and a wide pass band width.

Figure 6:
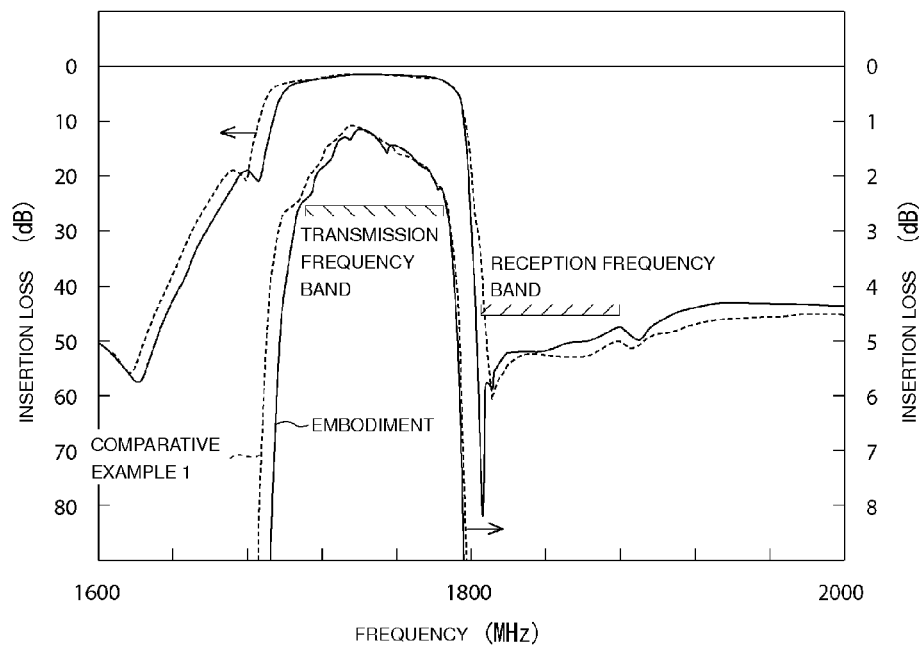
FIG. 6 is a graph illustrating a filter characteristic of a transmission filter in a surface acoustic wave filter device according to a preferred embodiment of the present invention and the filter characteristic of the transmission filter in the surface acoustic wave filter device of the comparative example 1.
Figure 7:
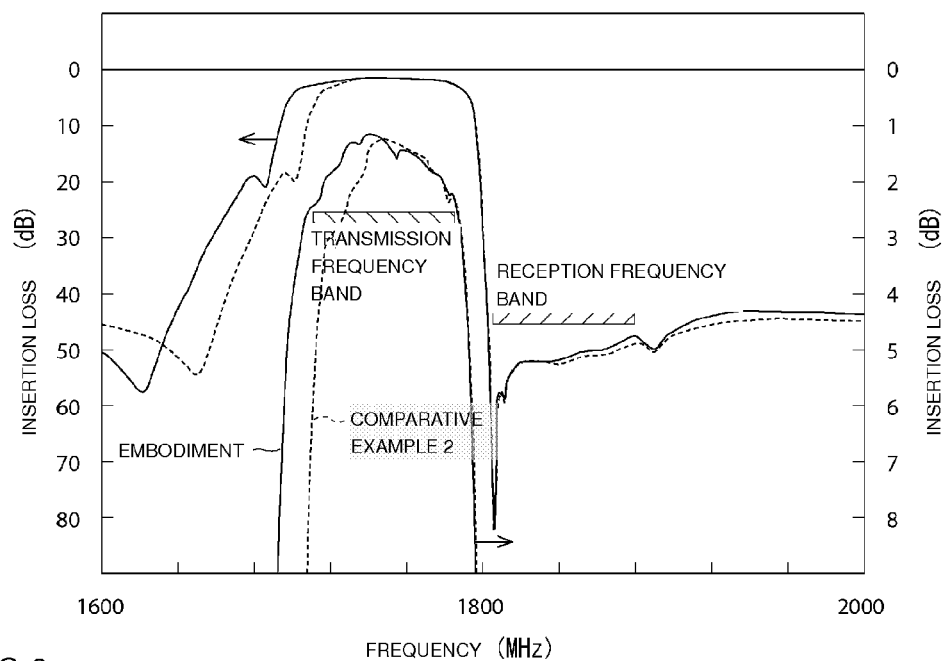
FIG. 7 is a graph illustrating a filter characteristic of a transmission filter in a surface acoustic wave filter device according to a preferred embodiment of the present invention and the filter characteristic of the transmission filter in the surface acoustic wave filter device of the comparative example 2.

In FIG. 6, the filter characteristic of the transmission filter 20 in the surface acoustic wave filter device 1 of the present preferred embodiment and the filter characteristic of the transmission filter in the surface acoustic wave filter device of the comparative example 1 are illustrated. In FIG. 6, a solid line indicates the present preferred embodiment, and a dashed line indicates the comparative example 1. In FIG. 7, the filter characteristic of the transmission filter 20 in the surface acoustic wave filter device 1 of the present preferred embodiment and the filter characteristic of the transmission filter in the surface acoustic wave filter device of the comparative example 2 are illustrated. In FIG. 7, a solid line indicates the present preferred embodiment, and a dashed line indicates the comparative example 2.

As described above, in the transmission filter 20 in the surface acoustic wave filter device 1 of the present preferred embodiment, the thickness t1 of the dielectric layer in the surface acoustic wave resonator 30 configuring the series arm resonators S1, S2, and S3 is thicker than the thickness t2 of the dielectric layer 43 in the surface acoustic wave resonator 40 configuring the parallel arm resonators P1, P2, and P3. Therefore, in the present preferred embodiment, as illustrated in FIG. 6, it is possible to obtain a pass band width approximately equivalent to the comparative example 1. Furthermore, as illustrated in FIG. 7, it is possible to obtain steepness equivalent to the comparative example 2.

In the present preferred embodiment, the thickness of the dielectric layer 33 in the surface acoustic wave resonator configuring the series arm resonators S1, S2, and S3 is increased, and hence, the Δf of the surface acoustic wave resonator 30 becomes small, and steepness on a pass band high-frequency side becomes high. On the other hand, the dielectric layer 43 in the surface acoustic wave resonator 40 configuring the parallel arm resonators P1, P2, and P3 is decreased, and hence, the Δf of the surface acoustic wave resonator 40 becomes large, and a pass band width becomes wide. In other words, in the present preferred embodiment where the thickness t1 of the dielectric layer 33 in the surface acoustic wave resonator 30 configuring the series arm resonators S1, S2, and S3 is thicker than the thickness t2 of the dielectric layer 43 in the surface acoustic wave resonator 40 configuring the parallel arm resonators P1, P2, and P3, it is possible to realize a filter characteristic having high steepness and a wide pass band width. Alternatively, in the preferred embodiment where the thickness t1 of the dielectric layer 33 in the surface acoustic wave resonator 30 configuring the series arm resonators S1, S2, and S3 is thinner than the thickness t2 of the dielectric layer 43 in the surface acoustic wave resonator 40 configuring the parallel arm resonators P1, P2, and P3, it is also possible to realize a filter characteristic having high steepness and a wide pass band width. By the thickness t1 of the dielectric layer 33 being reduced, the Δf of the surface acoustic wave resonator 30 becomes large, and hence, a pass band width becomes wide. The reason is that, by the thickness t2 of the dielectric layer 43 being increased, the Δf of the surface acoustic wave resonator becomes small and hence, steepness on a pass band low-frequency side becomes high.

Here, it is assumed that the wave lengths of the series arm resonators S1, S2, and S3 and the parallel arm resonators P1, P2, and P3 are λ(S1), λ(S2), λ(S3), λ(P1), λ(P2), and λ(P3), respectively.

Figure 23:
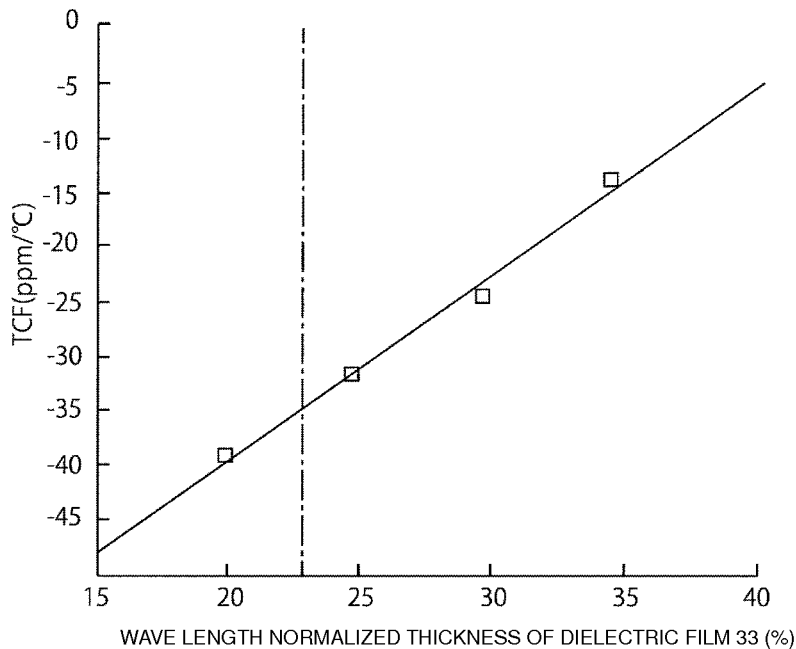
FIG. 23 is a graph illustrating a relationship between a film thickness of a dielectric film including silicon oxide and a TCF.

The TCF of a leaky wave in the $LiTaO_3$ substrate where no dielectric layer is provided preferably is about −35 [ppm/° C.]. In FIG. 23, a relationship between the film thickness of the dielectric film 33 including silicon oxide and a TCF in the series arm resonators S1, S2, and S3 is illustrated. In FIG. 23, a vertical axis is a TCF [ppm/° C.], and a horizontal axis is a wave length normalized film thickness where the film thickness [nm] of a dielectric film including silicon oxide is normalized using a wave length λ. From a result illustrated in FIG. 23, it is understood that, by setting the wave length normalized thickness of the dielectric layer to about 23% or more, it is possible to cause the TCF of the leaky wave in the LiTaO$_3$ substrate to be smaller than about −35 [ppm/° C.], for example. Accordingly, it is understood that it is desirable that the wave length normalized thickness of the dielectric layer 33 is set to about 23% or more, for example.

Figure 24:
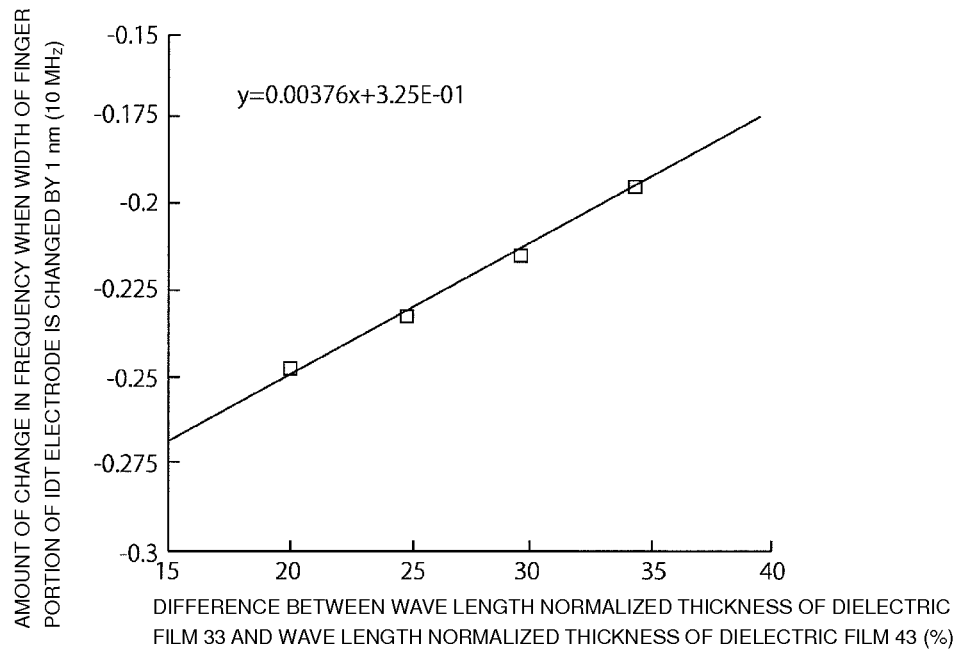
FIG. 24 is a graph illustrating a relationship between a film thickness of a dielectric film including silicon oxide and the amount of change in frequency when a width of a finger portion of an IDT electrode is changed by 1 nm.

When a difference between the thickness t1 of the dielectric layer 33 and the thickness t2 of the dielectric layer 43 becomes large, the amount of change in frequency tends to become large when the width of the electrode fingers in the IDT electrode changes by a unit length. In addition, a frequency band width tends to be highly dependent on the maximum wave length of the IDT electrodes in the series arm resonators S1, S2, and S3 and the minimum wave length of the IDT electrodes in the parallel arm resonators P1, P2, and P3. Here, when the amount of change in the width of electrode fingers, which is acceptable from the point of view of the forming accuracy of a commonly-used IDT electrode, preferably is about 40 nm, the acceptable amount of change in frequency, which corresponds to this, preferably is about 2.5 MHz, for example. FIG. 24 is a graph illustrating a relationship between the film thickness of a dielectric film including silicon oxide and the amount of change in frequency when the width of a finger portion of an IDT electrode is changed by about 1 nm, for example. From a result illustrated in FIG. 24, it is understood that, by setting a difference between the wave length normalized thickness of the dielectric layer 33 and the wave length normalized thickness of the dielectric layer 43 to about 16.6% or less, it is possible to set the acceptable amount of change in frequency to about 2.5 MHz or less, for example.

Incidentally, when, as in the present preferred embodiment, the transmission filter 20 uses the Rayleigh wave as the main mode, in some cases a ripple due to an SH wave serving as an unnecessary wave occurs within a pass band. Usually, this ripple due to the SH wave is suppressed by adjusting the θ of the Euler angles (φ, θ, ψ) of the LiNbO$_3$ substrate serving as a piezoelectric substrate. Specifically, by setting the θ of the Euler angles (φ, θ, ψ) of the LiNbO$_3$ substrate to about 25 degrees to about 45 degrees, in particular, by preferably setting to about 37.5 degrees, for example, the electromechanical coupling coefficient of the SH wave become sufficiently small, and the ripple due to the SH wave is suppressed. If, in the ladder type surface acoustic wave filter unit, the thicknesses of the dielectric layers are cause to be equal to each other in the surface acoustic wave resonator configuring the series arm resonator and the surface acoustic wave resonator configuring the parallel arm resonator, it is possible to suppress the ripple due to the SH wave using this technique.

However, in the present preferred embodiment, in the transmission filter 20 including the ladder type surface acoustic wave filter unit, the thickness t1 of the dielectric layer 33 in the surface acoustic wave resonator 30 configuring the series arm resonators S1, S2, and S3 is thicker than the thickness t2 of the dielectric layer 43 in the surface acoustic wave resonator 40 configuring the parallel arm resonators P1, P2, and P3 (t1>t2). Here, in a case where the Rayleigh wave is used as the main mode, when the thickness of a dielectric layer is different between a plurality of surface acoustic wave resonators, the values of θ most suitable to reduce the electromechanical coupling coefficient of the SH wave are also different.

Therefore, for example, in forming the surface acoustic wave resonator configuring the series arm resonator and the surface acoustic wave resonator configuring the parallel arm resonator using one piezoelectric substrate, if the thickness of the dielectric layer is different between the surface acoustic wave resonator configuring the series arm resonator and the surface acoustic wave resonator configuring the parallel arm resonator, when the θ most suitable for sufficiently reducing the electromechanical coupling coefficient of the SH wave is selected in the surface acoustic wave resonator configuring the series arm resonator, the selected θ becomes a value not most suitable in the surface acoustic wave resonator configuring the parallel arm resonator.

In other words, in forming the surface acoustic wave resonator configuring the series arm resonator and the surface acoustic wave resonator configuring the parallel arm resonator using one piezoelectric substrate, if the thickness of the dielectric layer is different between the surface acoustic wave resonator configuring the series arm resonator and the surface acoustic wave resonator configuring the parallel arm resonator, it is difficult to set θ most suitably for both of the series arm resonator and the parallel arm resonator in both of the surface acoustic wave resonator configuring the series arm resonator and the surface acoustic wave resonator configuring the parallel arm resonator, so as to reduce the electromechanical coupling coefficient of the SH wave. Accordingly, only by the setting of the Euler angle θ of the piezoelectric substrate, it is difficult to optimally suppress the ripple due to the SH wave with respect to each of the series arm resonator and the parallel arm resonator. The specific example thereof will be illustrated hereinafter.

Figure 8:
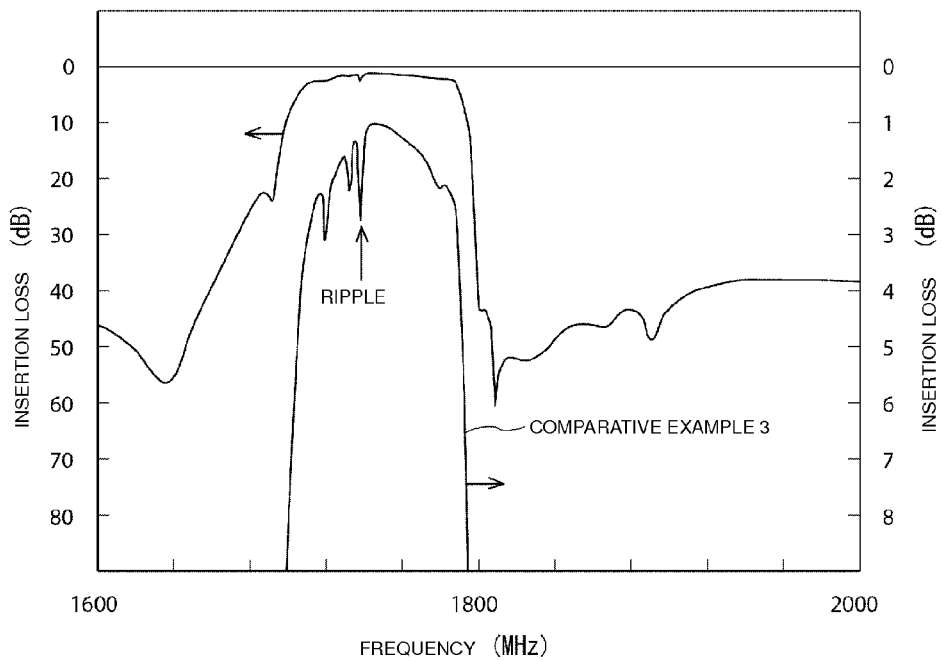
FIG. 8 is a graph illustrating a filter characteristic of a transmission filter in a surface acoustic wave filter device of a comparative example 3.

As a comparative example 3, a surface acoustic wave filter device is prepared where, in the transmission filter 20, the propagation orientation A1 of a surface acoustic wave in the surface acoustic wave resonator 30 configuring the series arm resonators S1, S2, and S3 is caused to be equal to the propagation orientation A2 of a surface acoustic wave in the surface acoustic wave resonator 40 configuring the parallel arm resonators P1, P2, and P3. In other words, in the comparative example 3, the surface acoustic wave resonators 30 and 40 are formed so that an angle defined by the propagation orientation A1 with the propagation orientation A2 becomes 0 degrees. Specifically, in the surface acoustic wave resonator 30 configuring the series arm resonators S1, S2, and S3 and the surface acoustic wave resonator 40 configuring the parallel arm resonators P1, P2, and P3, the ψ of the Euler angles (φ, θ, ψ) of a LiNbO$_3$ substrate serving as a piezoelectric substrate is set to 0 degrees. In FIG. 8, the filter characteristic of a transmission filter in the surface acoustic wave filter device of the comparative example 3 is illustrated.

In the surface acoustic wave filter device of the comparative example 3, the θ of the Euler angles (φ, θ, ψ) of the LiNbO$_3$ substrate serving as the piezoelectric substrate is set to 37.5 degrees, and hence, the electromechanical coupling coefficient of the SH wave occurring in the surface acoustic wave resonator configuring the series arm resonator becomes zero. As illustrated in FIG. 8, in the surface acoustic wave filter device of the comparative example 3, since the electromechanical coupling coefficient of the SH wave occurring in the surface acoustic wave resonator configuring the parallel arm resonator does not become sufficiently small, a ripple due to the SH wave is not sufficiently suppressed.

On the other hand, in the present preferred embodiment, the propagation orientation A1 of a surface acoustic wave in the surface acoustic wave resonator 30 configuring the series arm resonators S1, S2, and S3 is caused to be different from the propagation orientation A2 of a surface acoustic wave in the surface acoustic wave resonator 40 configuring the parallel arm resonators P1, P2, and P3. Specifically, in the Euler angles (φ, θ, ψ) of the LiNbO$_3$ substrate serving as the piezoelectric substrate 31, the ψ preferably is set to 0 degrees in the surface acoustic wave resonator 30, the ψ preferably is set to about −5 degrees in the surface acoustic wave resonator 40, and the surface acoustic wave resonators 30 and 40 are arranged so that an angle defined by the propagation orientation A1 with the propagation orientation A2 preferably becomes greater than 0 degrees and less than or equal to about 8 degrees, for example. In other words, in the present preferred embodiment, as illustrated in FIG. 2, the IDT electrodes 32 and 42 are arranged so that a difference between the propagation orientation A1 of a surface acoustic wave occurring in the surface acoustic wave resonator 30 configuring the series arm resonators S1, S2, and S3 and the propagation orientation A2 of a surface acoustic wave occurring in the surface acoustic wave resonator 40 configuring the parallel arm resonators P1, P2, and P3 preferably becomes greater than 0 degrees and less than or equal to about 8 degrees (in other words, a difference in propagation angle between the surface acoustic wave resonator 30 and the surface acoustic wave resonator 40 becomes greater than 0 degrees and less than or equal to about 8 degrees), for example.

In the present preferred embodiment, when the $\psi$ of the surface acoustic wave resonator 30 is 0 degrees, the $\theta$ of the Euler angles ($\phi$, $\theta$, $\psi$) of the piezoelectric substrate 31 is preferably set to about 37.5 degrees so that the electromechanical coupling coefficient of the SH wave occurring in the surface acoustic wave resonator 30 becomes zero. At this time, since the thicknesses of the dielectric layers 33 and 43 are different in the surface acoustic wave resonators 30 and 40, the value of $\theta$ most suitable for reducing the electromechanical coupling coefficient of the SH wave occurring in the surface acoustic wave resonator 40 is different from about 37.5 degrees. However, by setting the $\psi$ of the surface acoustic wave resonator 40 to about −5 degrees, it is possible to reduce, to zero, the electromechanical coupling coefficient of the SH wave occurring in the surface acoustic wave resonator 40.

In this way, even if the thickness of the dielectric layer is different between the surface acoustic wave resonator configuring the series arm resonator and the surface acoustic wave resonator configuring the parallel arm resonator, when the $\theta$ of the Euler angles ($\phi$, $\theta$, $\psi$) of the LiNbO$_3$ substrate serving as the piezoelectric substrate is set so that the electromechanical coupling coefficient of the SH wave occurring in the surface acoustic wave resonator configuring the series arm resonator is reduced, it is possible to reduce the electromechanical coupling coefficient of the SH wave occurring in the surface acoustic wave resonator configuring the parallel arm resonator, by adjusting the propagation orientation ($\psi$) of the surface acoustic wave in the surface acoustic wave resonator configuring the parallel arm resonator. As a result, it is possible to suppress the ripple due to the SH wave.

The $\phi$ and $\theta$ of the Euler angles ($\phi$, $\theta$, $\psi$) are angles determining the cut surface of a piezoelectric substrate propagating a surface acoustic wave, and the $\psi$ is an angle determining the propagation direction of the surface acoustic wave. Accordingly, as illustrated in FIG. 2, on the piezoelectric substrate of the same cut surface, the propagation orientation A1 of the surface acoustic wave in the surface acoustic wave resonator 30 and the propagation orientation A2 of the surface acoustic wave in the surface acoustic wave resonator 40 are caused to be different from each other, and hence, it is possible to obtain a condition where the electromechanical coupling coefficients of the SH wave are different.

Figure 9:
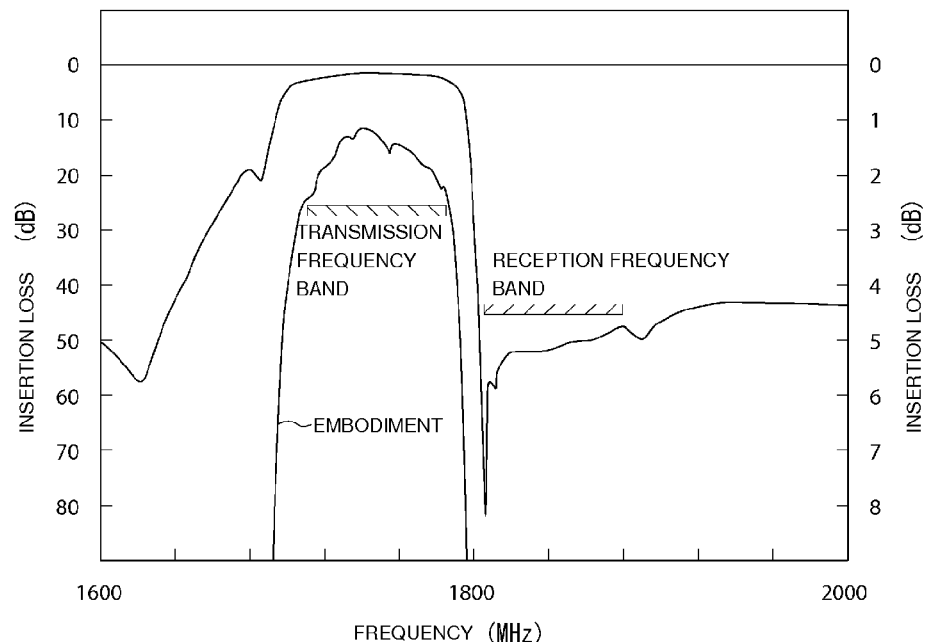
FIG. 9 is a graph illustrating a filter characteristic of a transmission filter in a surface acoustic wave filter device according to a preferred embodiment of the present invention.

In FIG. 9, the filter characteristic of the transmission filter 20 in the surface acoustic wave filter device 1 of the present preferred embodiment is illustrated. As illustrated in FIG. 9, in the present preferred embodiment, it is possible to realize a filter characteristic having high steepness and a wide pass band width and suppress the ripple due to the SH wave within a pass band.

While, in the present preferred embodiment, the $\psi$ of the surface acoustic wave resonator 30 preferably is set to 0 degrees, it is only necessary for the $\psi$ to be 0 degrees±1 degrees, for example. In the present preferred embodiment, when the $\psi$ of the surface acoustic wave resonator 30 preferably is 0 degrees±1 degrees, the $\theta$ of the Euler angles ($\phi$, $\theta$, $\psi$) of the piezoelectric substrate 31 preferably is set to about 37.5 degrees so that the electromechanical coupling coefficient of the SH wave occurring in the surface acoustic wave resonator 30 becomes zero, and the $\psi$ of the surface acoustic wave resonator 40 preferably is set to about −5 degrees, for example. However, an angle may be adopted so that an angle defined by the propagation orientation A1 with the propagation orientation A2 preferably becomes about 1 degrees to about 8 degrees, or preferably becomes 3.5 degrees to 6.5 degrees. Accordingly, it is possible to reduce, to zero, the electromechanical coupling coefficient of the SH wave occurring in the surface acoustic wave resonator 40. In this regard, however, the present invention is not limited to this configuration. After taking into account the thicknesses of the IDT electrodes 32, 42 and the thicknesses of the dielectric layers 33 and 43, and the like, the $\psi$ of the surface acoustic wave resonators 30 and 40 may be set to optimum values.

Next, the reason that when the $\psi$ of the surface acoustic wave resonator 30 is 0 degrees±1 degrees, it is desirable that the $\psi$ of the surface acoustic wave resonator 40 is about 1 degrees to about 8 degrees, it is more desirable that the $\psi$ of the surface acoustic wave resonator 40 is about 3.5 degrees to about 6.5 degrees, and it is even more desirable that the $\psi$ of the surface acoustic wave resonator 40 is about 5 degrees, for example, will be described in detail on the basis of an experimental example.

Figure 10:
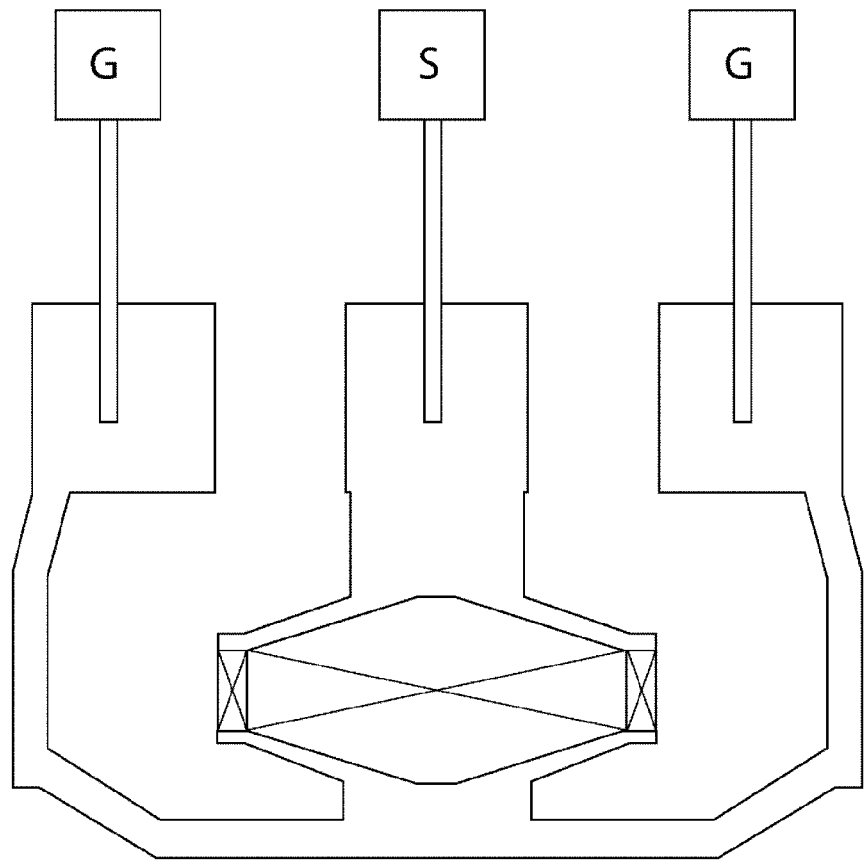
FIG. 10 is a schematic plan view of an IDT electrode of a one-port type surface acoustic wave resonator manufactured in an experimental example.

First, a plurality of one-port type surface acoustic wave resonators such a one-port type surface acoustic wave resonator illustrated in FIG. 10 were manufactured with variously changing, within the range of 0 degrees to about 10 degrees, the $\psi$ of the Euler angles (0°, 37.5°, $\psi$) of a LiNbO$_3$ substrate serving as the piezoelectric substrate 31, each of the plural one-port type surface acoustic wave resonators having substantially the same configuration as the surface acoustic wave resonator 40 configuring the parallel arm resonator of the above-mentioned preferred embodiment. In addition, the configuration of this one-port type surface acoustic wave resonator is the same as the IDT electrodes 32 and 42 of the present preferred embodiment.

Next, using probes having a ground terminal and a signal terminal, the impedance characteristic and the return loss of the one-port type surface acoustic wave resonator were measured. Results are illustrated in FIG. 11 to FIG. 20. In addition, in FIG. 10, G indicates the probe having the ground terminal and S indicates the probe having the signal terminal.

Figure 11:
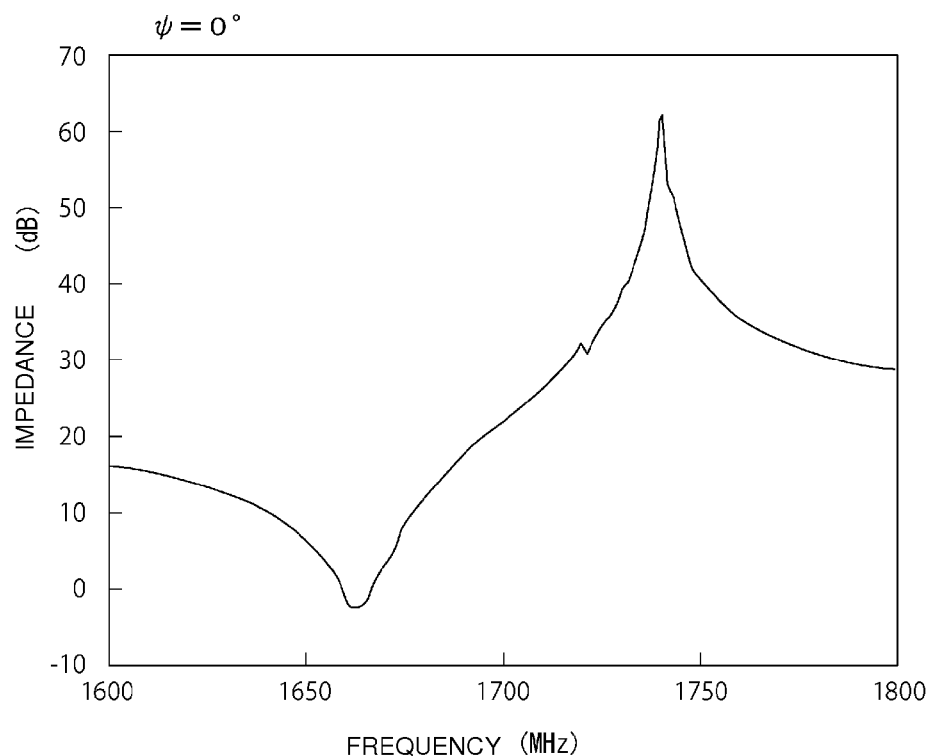
FIG. 11 is a graph illustrating an impedance characteristic of a one-port type surface acoustic wave resonator in the case of ψ=0 degrees.
Figure 12:
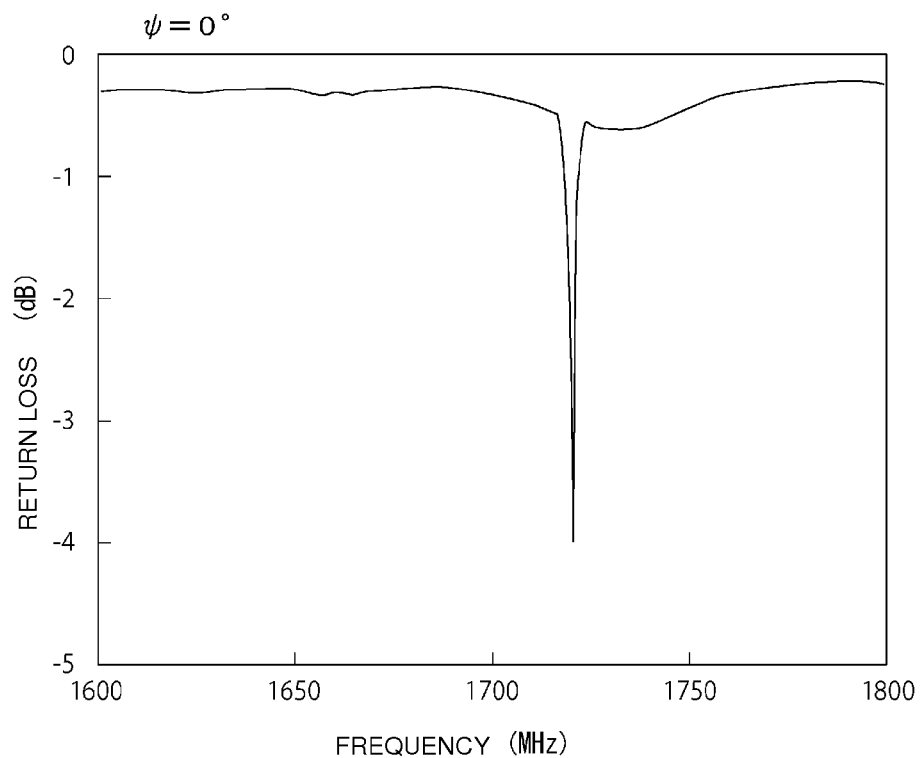
FIG. 12 is a graph illustrating a return loss of a one-port type surface acoustic wave resonator in the case of ψ=0 degrees.
Figure 13:
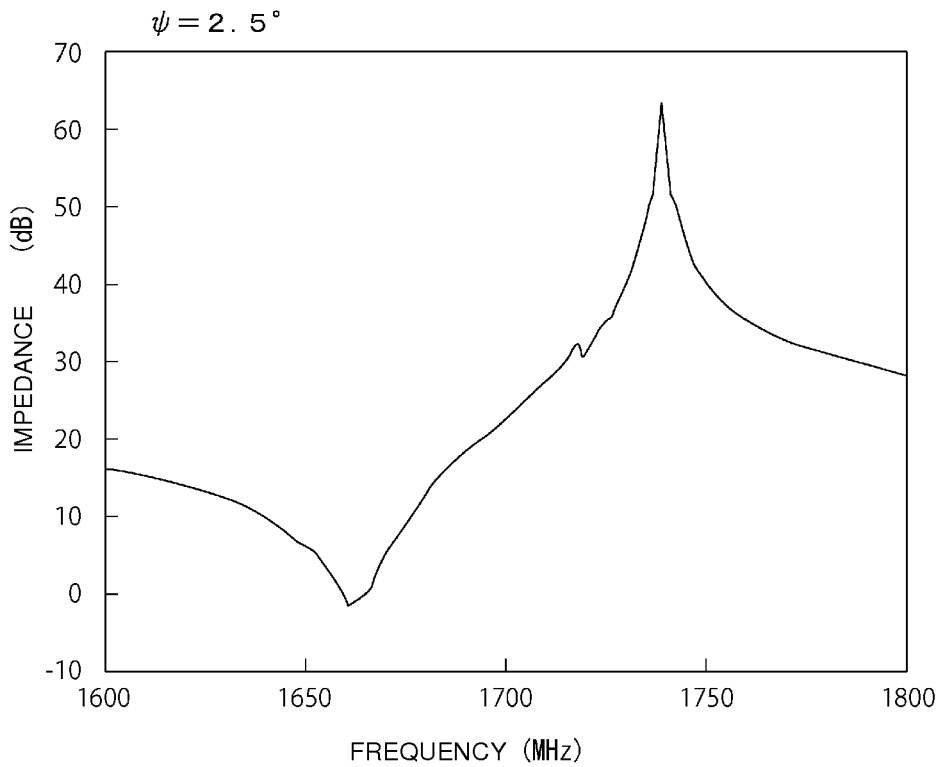
FIG. 13 is a graph illustrating an impedance characteristic of a one-port type surface acoustic wave resonator in the case of ψ=2.5 degrees.
Figure 14:
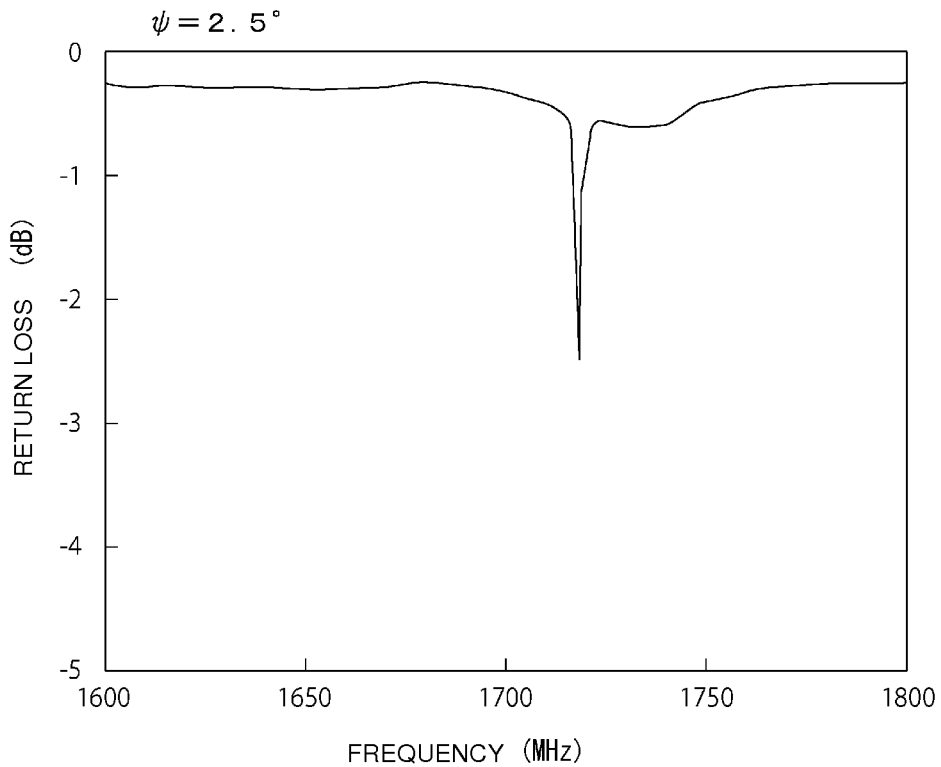
FIG. 14 is a graph illustrating a return loss of a one-port type surface acoustic wave resonator in the case of ψ=2.5 degrees.
Figure 15:
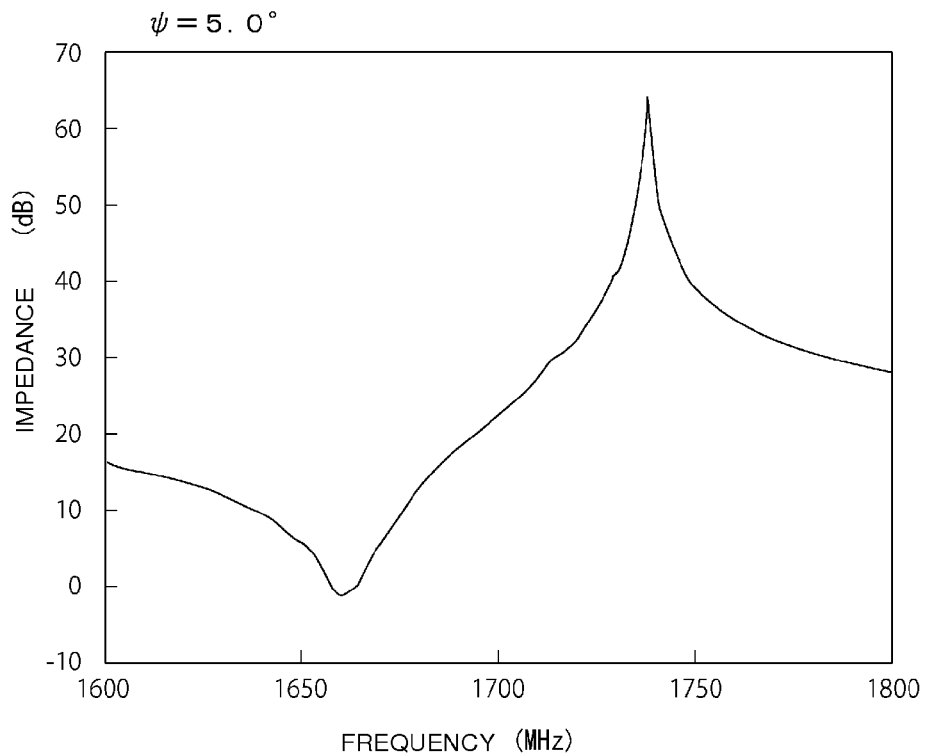
FIG. 15 is a graph illustrating an impedance characteristic of a one-port type surface acoustic wave resonator in the case of ψ=5.0 degrees.
Figure 16:
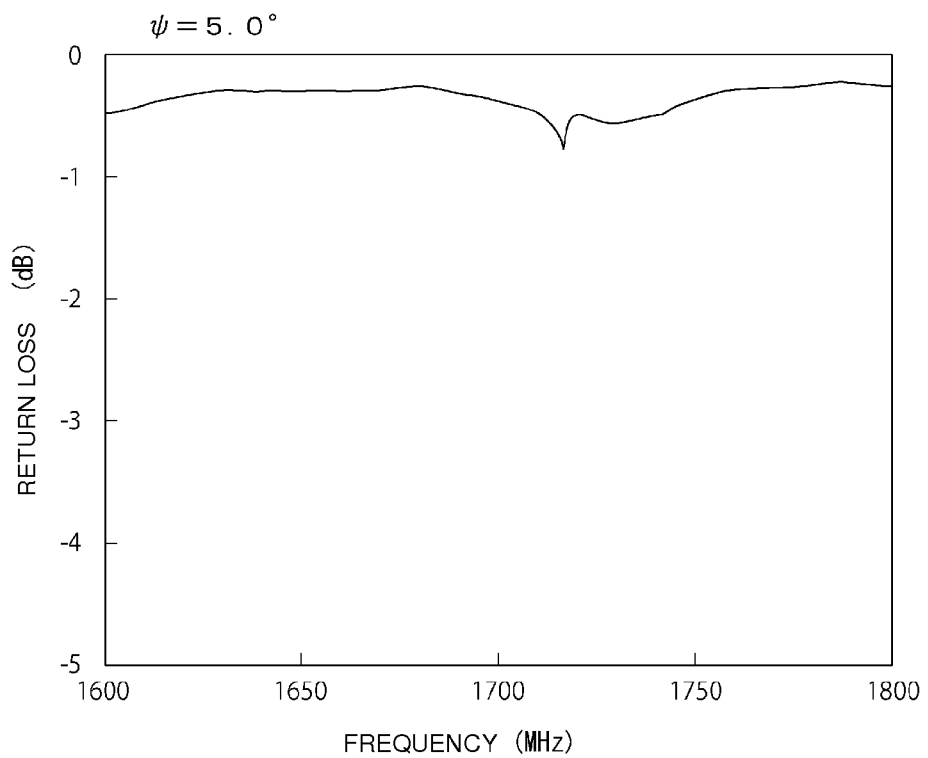
FIG. 16 is a graph illustrating a return loss of a one-port type surface acoustic wave resonator in the case of ψ=5.0 degrees.

FIG. 11 is a graph illustrating the impedance characteristic of a one-port type surface acoustic wave resonator in the case of $\psi$=0 degrees. FIG. 12 is a graph illustrating the return loss of a one-port type surface acoustic wave resonator in the case of $\psi$=0 degrees. FIG. 13 is a graph illustrating the impedance characteristic of a one-port type surface acoustic wave resonator in the case of $\psi$=2.5 degrees. FIG. 14 is a graph illustrating the return loss of a one-port type surface acoustic wave resonator in the case of $\psi$=2.5 degrees. FIG. 15 is a graph illustrating the impedance characteristic of a one-port type surface acoustic wave resonator in the case of $\psi$=5.0 degrees. FIG. 16 is a graph illustrating the return loss of a one-port type surface acoustic wave resonator in the case of $\psi$=5.0 degrees.

Figure 17:
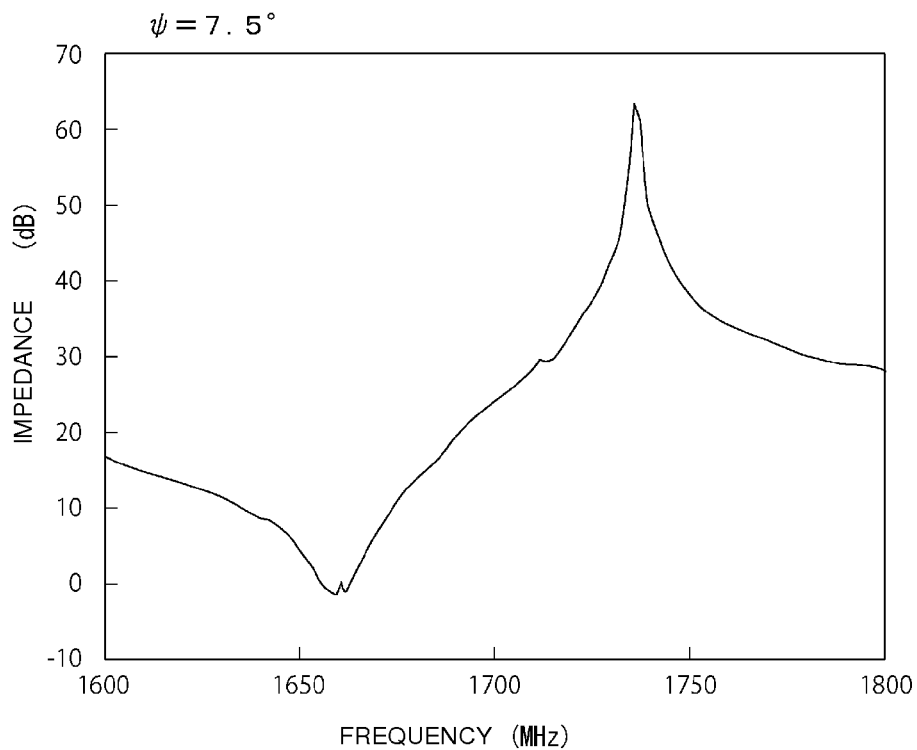
FIG. 17 is a graph illustrating an impedance characteristic of a one-port type surface acoustic wave resonator in the case of ψ=7.5 degrees.
Figure 18:
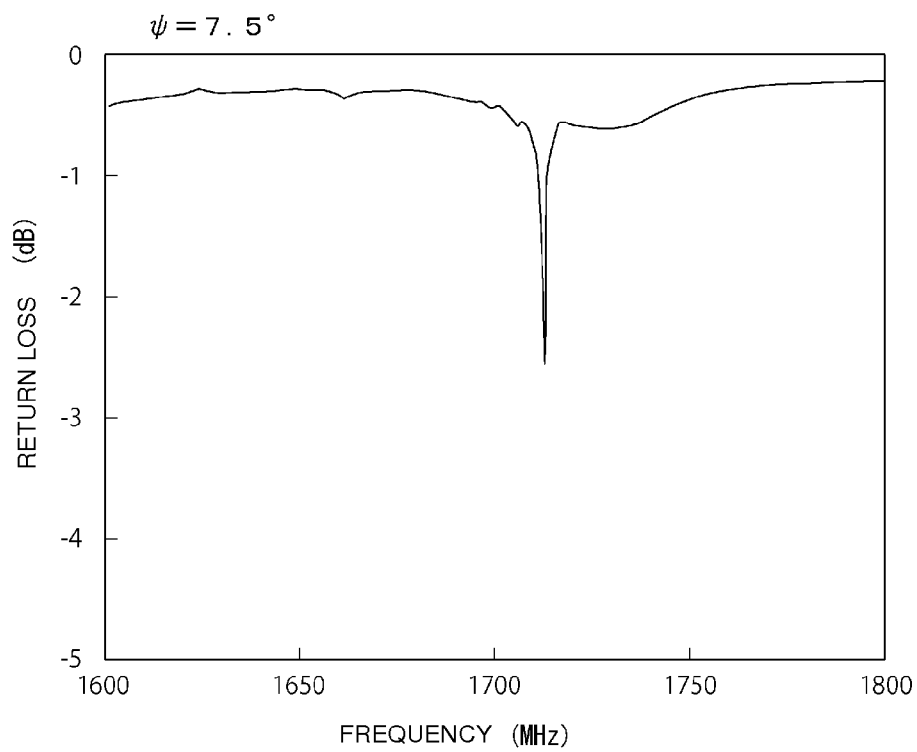
FIG. 18 is a graph illustrating a return loss of a one-port type surface acoustic wave resonator in the case of ψ=7.5 degrees.
Figure 19:
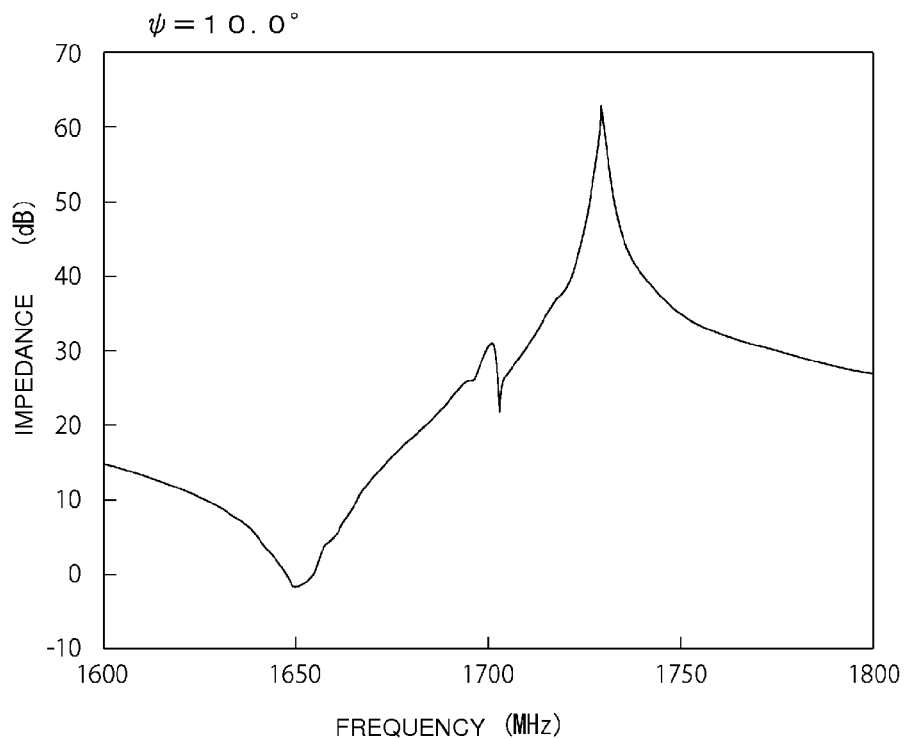
FIG. 19 is a graph illustrating an impedance characteristic of a one-port type surface acoustic wave resonator in the case of ψ=10 degrees.
Figure 20:
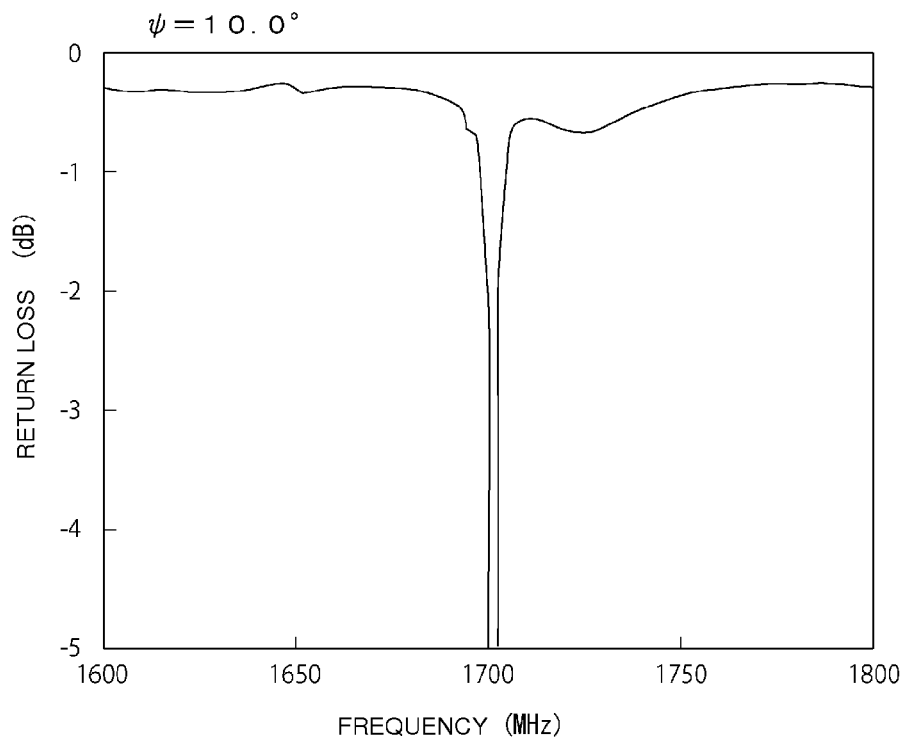
FIG. 20 is a graph illustrating a return loss of a one-port type surface acoustic wave resonator in the case of ψ=10 degrees.
Figure 21:
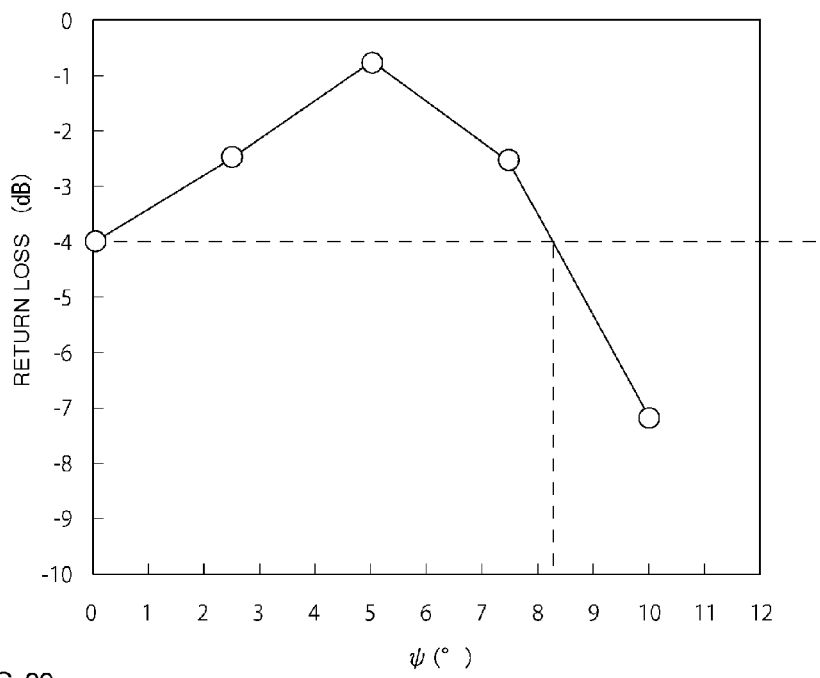
FIG. 21 is a graph illustrating a relationship between ψ of Euler angles (φ, θ, ψ) and the magnitude of a return loss of a ripple due to an SH wave.

FIG. 17 is a graph illustrating the impedance characteristic of a one-port type surface acoustic wave resonator in the case of ψ=7.5 degrees. FIG. 18 is a graph illustrating the return loss of a one-port type surface acoustic wave resonator in the case of ψ=7.5 degrees. FIG. 19 is a graph illustrating the impedance characteristic of a one-port type surface acoustic wave resonator in the case of ψ=10 degrees. FIG. 20 is a graph illustrating the return loss of a one-port type surface acoustic wave resonator in the case of ψ=10 degrees. FIG. 21 is a graph illustrating a relationship between the ψ of the Euler angles (φ, θ, ψ) of the LiNbO$_3$ substrate serving as the piezoelectric substrate 31 and the magnitude of the return loss of a ripple due to an SH wave.

From results illustrated in FIG. 11 to FIG. 21, it is understood that, by causing the ψ to be larger than 0 degrees and smaller than 8 degrees, it is possible to suppress a ripple due to an SH wave occurring in a surface acoustic wave resonator configuring a parallel arm resonator.

Figure 22:
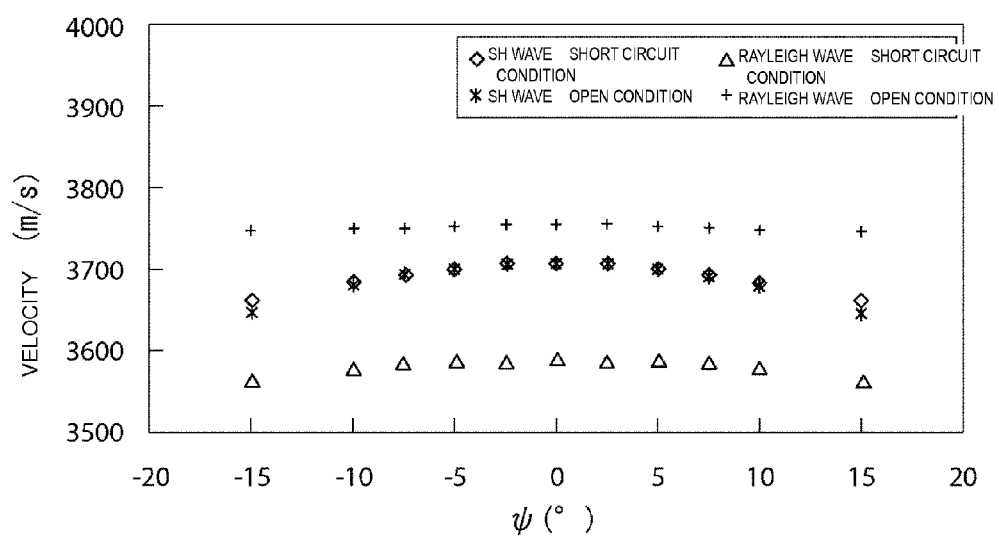
FIG. 22 is a graph illustrating an acoustic velocity of each of a Rayleigh wave and an SH wave when electrode fingers of an IDT electrode are not short-circuited and an acoustic velocity of each of a Rayleigh wave and an SH wave when electrode fingers of an IDT electrode are short-circuited, in a one-port type surface acoustic wave resonator of an experimental example.

Next, the acoustic velocity of each of a Rayleigh wave and an SH wave when the electrode fingers of an IDT electrode were not short-circuited and the acoustic velocity of each of a Rayleigh wave and an SH wave when the electrode fingers of an IDT electrode were short-circuited were obtained. The result thereof is illustrated in FIG. 22. From the result illustrated in FIG. 22, it is understood that the acoustic velocity of each of the Rayleigh wave and the SH wave when the electrode fingers of an IDT electrode are not short-circuited and the acoustic velocity of each of the Rayleigh wave and the SH wave when the electrode fingers of an IDT electrode are short-circuited are symmetric with respect to a boundary between positive and negative ranges, the boundary being the ψ=0 degrees of the LiNbO$_3$ substrate serving as the piezoelectric substrate. Accordingly, it is understood that, by causing the ψ to be smaller than 0 degrees and larger than about −8 degrees, for example, it is also possible to suppress a ripple due to the SH wave occurring in the surface acoustic wave resonator configuring the parallel arm resonator.

Next, a non-limiting example of a manufacturing method for the transmission filter 20 of the present preferred embodiment will be described.

First, the IDT electrodes 32 and 42 are formed on the piezoelectric substrate 31. The IDT electrodes 32 and 42 may be formed by, for example, a vapor deposition method or a sputtering method. It is desirable that the IDT electrodes 32 and 42 are formed by a lift-off process utilizing the vapor deposition method.

Next, on the IDT electrodes 32 and 42 and the main surface 31a of the piezoelectric substrate 31, a SiO$_2$ layer is formed so as to cover the IDT electrodes 32 and 42. The SiO$_2$ layer may be formed by, for example, a bias sputtering method or the like. Next, the surface of the formed SiO$_2$ layer is planarized by an etch back process.

Next, by forming a mask including a resist or the like, in a portion in the SiO$_2$ layer, located on the IDT electrode 32, and etching a portion in the SiO$_2$ layer, located on the IDT electrode 42, SiO$_2$ layers 33a and 43a are formed. After that, the mask is removed.

Finally, by forming SiN layers 33b and 43b, the transmission filter 20 may be formed.

While, in the above-mentioned preferred embodiments, the transmission frequency band is preferably located on the low-frequency side compared with the reception frequency band, when the transmission frequency band is located on the high-frequency side compared with the reception frequency band, the transmission filter is desired to have a filter characteristic where steepness on the pass band low-frequency side is high. Therefore, the thickness t1 of the dielectric layer 33 in the surface acoustic wave resonator 30 configuring the series arm resonator is thinner than the thickness t2 of the dielectric layer 43 in the surface acoustic wave resonator 40 configuring the parallel arm resonator (t2>t1), and in the Euler angles (φ, θ, ψ) of the LiNbO$_3$ substrate serving as the piezoelectric substrate 31, the ψ of the surface acoustic wave resonator 30 is set to 0 degrees±1 degrees, for example. Accordingly, it is possible to realize a filter characteristic having high steepness and a wide pass band width and suppress the ripple due to the SH wave within the pass band.

In detail, the thickness of the dielectric layer 33 in the surface acoustic wave resonator 30 is decreased, and hence, the Δf of the surface acoustic wave resonator 30 becomes large, and the pass band width becomes wide. In addition, the thickness of the dielectric layer 43 in the surface acoustic wave resonator 40 is increased, and hence, the Δf of the surface acoustic wave resonator 40 becomes small, and the steepness on the pass band low-frequency side becomes high. Furthermore, by setting the W of the surface acoustic wave resonator 30 to 1 degrees to about 8 degrees and setting the W of the surface acoustic wave resonator 40 to 0 degrees±1 degrees, for example, the ripple due to the SH wave within the pass band is suppressed. Also in this case, an angle may be adopted so that an angle formed by the propagation orientation A1 with the propagation orientation A2 preferably becomes about 1 degrees to about 8 degrees, or preferably becomes about 3.5 degrees to about 6.5 degrees, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave filter device comprising:
a ladder surface acoustic wave filter unit including:
a series arm;
a series arm resonator connected in the series arm;
a parallel arm arranged to connect the series arm and ground to each other; and
a parallel arm resonator provided in the parallel arm; wherein
the ladder surface acoustic wave filter unit uses a Rayleigh wave as a main mode;
each of the series arm resonator and the parallel arm resonator includes a surface acoustic wave resonator including a piezoelectric substrate, an IDT electrode located on the piezoelectric substrate, and a dielectric layer arranged so as to cover the IDT electrode;
a thickness of the dielectric layer in the surface acoustic wave resonator configuring the series arm resonator is different from a thickness of the dielectric layer in the surface acoustic wave resonator configuring the parallel arm resonator, and a propagation orientation of a surface acoustic wave in the surface acoustic wave resonator configuring the series arm resonator is different from a propagation orientation of a surface acoustic wave in the surface acoustic wave resonator configuring the parallel arm resonator;
the piezoelectric substrate is a LiNbO$_3$ substrate including Euler angles (φ, θ, ψ), wherein θ is within a range of about 25 degrees to about 45 degrees and ψ corresponds to a propagation orientation of the surface acoustic wave in the surface acoustic wave resonator configuring the series arm resonator and a propagation orientation of the surface acoustic wave in the surface acoustic wave resonator configuring the parallel arm resonator;

an angle defined by the propagation orientation of the surface acoustic wave in the surface acoustic wave resonator configuring the series arm resonator with the propagation orientation of the surface acoustic wave in the surface acoustic wave resonator configuring the parallel arm resonator is larger than 0 degrees and less than or equal to about 8 degrees; and the dielectric layer in the surface acoustic wave resonator configuring the series arm resonator is thicker than the dielectric layer in the surface acoustic wave resonator configuring the parallel arm resonator, ψ of the surface acoustic wave resonator configuring the series arm resonator is within a range of 0 degrees±1 degrees, and ψ of the surface acoustic wave resonator configuring the parallel arm resonator is within a range of about 1 degrees to about 8 degrees.

2. The surface acoustic wave filter device according to claim 1, wherein ψ of the surface acoustic wave resonator configuring the parallel arm resonator falls within a range of about 3.5 degrees to about 6.5 degrees.

3. The surface acoustic wave filter device according to claim 1, wherein the dielectric layer includes a $SiO_2$ layer.

4. The surface acoustic wave filter device according to claim 1, wherein the piezoelectric substrate in the series arm resonator and the piezoelectric substrate in the parallel arm resonator are a common piezoelectric substrate.

5. The surface acoustic wave filter device according to claim 1, wherein the series arm resonator includes a plurality of surface acoustic wave resonators functioning as one resonator.

6. The surface acoustic wave filter device according to claim 1, wherein the surface acoustic wave filter device is a duplexer or triplexer.

7. The surface acoustic wave filter device to claim 1, wherein the ladder surface acoustic wave filter unit is included in at least one of a reception filter and a transmission filter.

8. The surface acoustic wave filter device according to claim 1, wherein the series arm includes a plurality of the series arm resonators that each includes a plurality of surface acoustic wave resonators functioning as one resonator.

9. The surface acoustic wave filter device according to claim 1, wherein the parallel arm includes a plurality of the parallel arm resonators that each includes a plurality of surface acoustic wave resonators functioning as one resonator.

10. The surface acoustic wave filter device according to claim 1, wherein the surface acoustic wave filter device has a transmission frequency band of 1710 MHz to 1785 MHz and a reception frequency band of 1850 MHz to 1910 MHz.

11. The surface acoustic wave filter device according to claim 1, wherein θ is about 37.5 degrees.

12. A communication device comprising:
an RF circuit; and
the surface acoustic wave filter device according to claim 1 mounted on the RF circuit.

13. The communication device according to claim 12, wherein the communication device is a cellular telephone.

14. A surface acoustic wave filter device comprising:
a ladder surface acoustic wave filter unit including:
  a series arm;
  a series arm resonator connected in the series arm;
  a parallel arm arranged to connect the series arm and ground to each other; and
  a parallel arm resonator provided in the parallel arm; wherein
the ladder surface acoustic wave filter unit uses a Rayleigh wave as a main mode;
each of the series arm resonator and the parallel arm resonator includes a surface acoustic wave resonator including a piezoelectric substrate, an IDT electrode located on the piezoelectric substrate, and a dielectric layer arranged so as to cover the IDT electrode;
a thickness of the dielectric layer in the surface acoustic wave resonator configuring the series arm resonator is different from a thickness of the dielectric layer in the surface acoustic wave resonator configuring the parallel arm resonator, and a propagation orientation of a surface acoustic wave in the surface acoustic wave resonator configuring the series arm resonator is different from a propagation orientation of a surface acoustic wave in the surface acoustic wave resonator configuring the parallel arm resonator;
the piezoelectric substrate is a $LiNbO_3$ substrate including Euler angles (φ, θ, ψ), wherein θ is within a range of about 25 degrees to about 45 degrees and ψ corresponds to a propagation orientation of the surface acoustic wave in the surface acoustic wave resonator configuring the series arm resonator and a propagation orientation of the surface acoustic wave in the surface acoustic wave resonator configuring the parallel arm resonator;
an angle defined by the propagation orientation of the surface acoustic wave in the surface acoustic wave resonator configuring the series arm resonator with the propagation orientation of the surface acoustic wave in the surface acoustic wave resonator configuring the parallel arm resonator is larger than 0 degrees and less than or equal to about 8 degrees; and
the dielectric layer in the surface acoustic wave resonator configuring the series arm resonator is thinner than the dielectric layer in the surface acoustic wave resonator configuring the parallel arm resonator, ψ of the surface acoustic wave resonator configuring the series arm resonator falls within a range of about 1 degrees to about 8 degrees, and ψ of the surface acoustic wave resonator configuring the parallel arm resonator falls within a range of 0 degrees±1 degrees.

15. The surface acoustic wave filter device according to claim 14, wherein ψ of the surface acoustic wave resonator configuring the series arm resonator falls within a range of about 3.5 degrees to about 6.5 degrees.

16. The surface acoustic wave filter device according to claim 14, wherein the series arm includes a plurality of the series arm resonators that each includes a plurality of surface acoustic wave resonators functioning as one resonator.

17. The surface acoustic wave filter device according to claim 4, wherein the parallel arm includes a plurality of the parallel arm resonators that each includes a plurality of surface acoustic wave resonators functioning as one resonator.

18. The surface acoustic wave filter device according to claim 14, wherein θ is about 37.5 degrees.

19. A communication device comprising:
an RF circuit; and
the surface acoustic wave filter device according to claim 14 mounted on the RF circuit.

20. The communication device according to claim 19, wherein the communication device is a cellular telephone.

* * * * *